(12) United States Patent
Sung et al.

(10) Patent No.: US 10,867,972 B2
(45) Date of Patent: *Dec. 15, 2020

(54) NANOSCALE LED ELECTRODE ASSEMBLY HAVING IMPROVED ELECTRICAL CONTACT AND MANUFACTURING METHOD THEREOF

(71) Applicant: SAMSUNG DISPLAY CO., LTD., Yongin-si (KR)

(72) Inventors: Yeon Goog Sung, Goyang-si (KR); Young Rag Do, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/701,117

(22) Filed: Dec. 2, 2019

(65) Prior Publication Data

US 2020/0105726 A1 Apr. 2, 2020

Related U.S. Application Data

(63) Continuation of application No. 15/855,767, filed on Dec. 27, 2017, now Pat. No. 10,497,680.

(30) Foreign Application Priority Data

Dec. 28, 2016 (KR) ........................ 10-2016-0181410

(51) Int. Cl.
*H01L 25/075* (2006.01)
*H01L 33/20* (2010.01)
*H01L 33/62* (2010.01)

(52) U.S. Cl.
CPC .......... *H01L 25/0753* (2013.01); *H01L 33/20* (2013.01); *H01L 33/62* (2013.01); *H01L 2933/0066* (2013.01)

(58) Field of Classification Search
CPC ..... H01L 25/0753; H01L 33/62; H01L 33/20; H01L 2933/0066
See application file for complete search history.

(56) References Cited

U.S. PATENT DOCUMENTS

| 9,997,501 | B2 | 6/2018 | Bower et al. |
| 10,497,680 | B2 * | 12/2019 | Sung ....................... H01L 33/20 |
| 2009/0122310 | A1 | 5/2009 | Zhang et al. |
| 2013/0240348 | A1 | 9/2013 | Mi et al. |
| 2016/0172339 | A1 | 6/2016 | Do |
| 2016/0211245 | A1 | 7/2016 | Do |
| 2017/0352646 | A1 | 12/2017 | Bower et al. |

FOREIGN PATENT DOCUMENTS

| KR | 10-1163646 B1 | 7/2012 |
| KR | 10-1244926 B1 | 3/2013 |
| KR | 10-1627365 B1 | 6/2016 |

* cited by examiner

*Primary Examiner* — Kyoung Lee
(74) *Attorney, Agent, or Firm* — Lewis Roca Rothgerber Christie LLP

(57) ABSTRACT

Provided are a method of manufacturing a nanoscale light-emitting diode (LED) electrode assembly having improved electrical contacts, and more particularly, a nanoscale LED electrode assembly having improved electrical contacts and capable of increasing conductivity between electrodes and nanoscale LED devices and decreasing contact resistance, and a method of manufacturing the same.

20 Claims, 12 Drawing Sheets

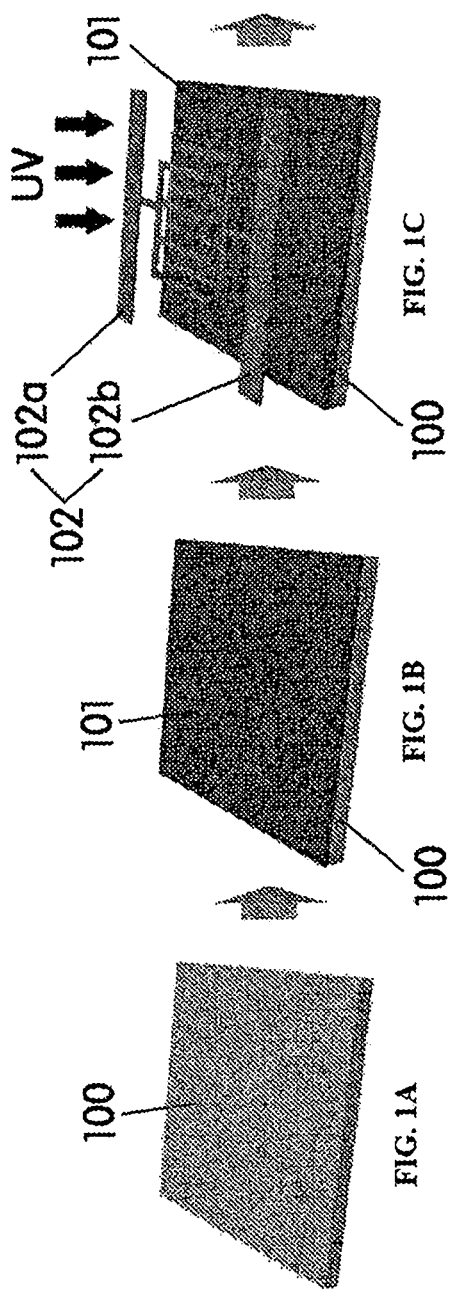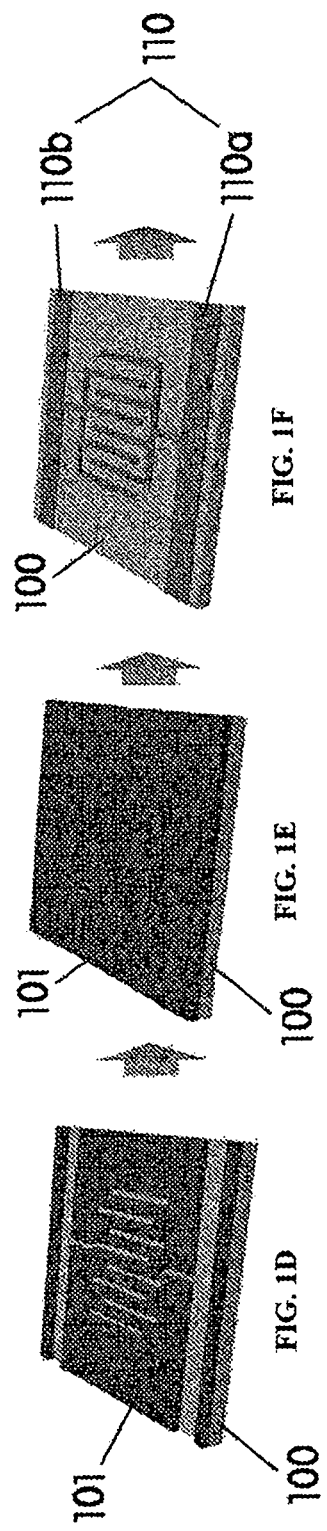

NANOSCALE LED ELECTRODE ASSEMBLY HAVING IMPROVED ELECTRICAL CONTACT AND MANUFACTURING METHOD THEREOF

CROSS-REFERENCE TO RELATED APPLICATIONS

This application is a continuation of U.S. patent application Ser. No. 15/855,767, filed Dec. 27, 2017, which claims priority to and the benefit of Korean Patent Application No. 10-2016-0181410, filed Dec. 28, 2016, the entire content of both of which is incorporated herein by reference.

BACKGROUND

1. Field of the Invention

The present invention relates to a nanoscale light-emitting diode (LED) electrode assembly having improved electrical contacts and a method of manufacturing the same, and more particularly, to a nanoscale LED electrode assembly having improved electrical contacts, in which conductivity between an electrode and a nanoscale LED device can be increased and contact resistance can be decreased, and a method of manufacturing the same.

2. Discussion of Related Art

Light-emitting diodes (LEDs) have been actively developed since Nakamura et al. of NICHIA Chemical of Japan succeeded in 1992 in fusing a high-quality single crystal GaN nitride semiconductor by applying a low-temperature GaN compound buffer layer. An LED is a semiconductor device in which n type semiconductor crystals of which a large number of carriers are electrons and p type semiconductor crystals of which a large number of carriers are holes are combined due to the properties of a compound semiconductor, and which is configured to convert an electrical signal into light having a desired wavelength band and emit the light.

Such an LED semiconductor has high light conversion efficiency, and thus has very low energy consumption, has a semi-permanent lifespan, and is eco-friendly. Thus, the LED semiconductor, which is a green material, is referred to as the revolution of light. Recently, with the development of compound semiconductor technology, high-brightness red, orange, green, blue, and white LEDs have been developed and applied in various fields including traffic lights, cellular phones, vehicle headlamps, outdoor electronic displays, LCD back-light units (BLUs), indoor/output lightings, etc. Research has been actively conducted thereon at home and abroad. In particular, a GaN-based compound semiconductor having a wide bandgap is a material used to manufacture LED semiconductors emitting green light, blue light, and light of an ultraviolet (UV) region, and a white LED device may be manufactured using blue LEDs. Therefore, much research has been conducted thereon.

Since LED semiconductors have been applied in various fields and research has been conducted thereon, high-output LED semiconductors have become necessary and improvement of the efficiency of LED semiconductors has become very important. However, there are many difficulties in manufacturing a high-efficiency and high-output blue LED device.

Improving the efficiency of a blue LED device is, however, difficult in terms of the manufacturing process and the high refractive index of the GaN-based semiconductor of a manufactured blue LED with respect to the atmosphere.

First, the manufacturing process of a blue LED device is difficult since a substrate having the same lattice constant as the GaN-based semiconductor is difficult to manufacture. When the difference between a lattice constant of a GaN epitaxial layer formed on the substrate and a lattice constant of the substrate is large, many errors may occur and thus the efficiency and performance of the blue LED device may decrease.

Next, light emitted from an active layer region of a manufactured blue LED is not discharged to the outside and is totally reflected within the blue LED due to a high refractive index of the GaN-based semiconductor thereof with respect to the atmosphere. The totally reflected light is reabsorbed within the blue LED and thus the efficiency of the blue LED is low. This efficiency is referred to as the LED device's light extraction efficiency. Much research has been conducted to resolve decreased light extraction efficiency.

An LED device and electrodes supplying power to the LED device are needed to apply the LED device to lighting, displays, and the like, and thus research has been conducted on various arrangements of the LED device and two different electrodes thereof with regard to purpose of use, decreasing space for electrodes, or manufacturing process.

Research on arrangement of an LED device and electrodes thereof may be classified into research on growing an LED device on electrodes and research on a method of separately and independently growing an LED device and then arranging the LED device on electrodes.

First, the research on the growing an LED device on the electrodes includes a bottom-up method of simultaneously manufacturing and arranging an LED device and electrodes in a series of manufacturing processes by sequentially forming a thin-film lower electrode, an n type semiconductor layer, an active layer, a p type semiconductor layer, and an upper electrode on a substrate and etching these layers, or by etching previously stacked layers before an upper electrode is stacked and then stacking the upper electrode Next, in the method of separately and independently growing an LED device and arranging the LED device on electrodes, LED devices which are independently grown using a separate process are individually arranged on patterned electrodes.

However, the former method is disadvantageous in that the growth of a high-crystalline/high-efficiency thin film and an LED device is very difficult crystallographically. The latter method is disadvantageous in that light extraction efficiency is low and thus luminous efficiency may be low.

The latter method is also disadvantageous in that a general LED device, which is a three-dimensional (3D) LED, device can be connected in an erected from to electrodes, but when an LED device is a nanoscale device, the LED device is very difficult to arrange upright on electrodes. Korean Patent Application No. 2011-0040174 of the inventor of the present application discloses a coupling linker configured to easily couple a nanoscale LED device to an electrode in a state in which the LED device is three-dimensionally arranged upright. However, when this application is actually applied to a nanoscale electrode, a nanoscale LED device is very difficult to couple to the electrode in a state in which the LED device is three-dimensionally arranged upright.

Furthermore, LED devices independently manufactured should be individually arranged on patterned electrodes. However, if the LED devices are nanoscale devices, the nanoscale LED devices are very difficult to arrange within a desired region of two different nanoscale electrodes. Even when the nanoscale LED devices are arranged on the two different nanoscale electrodes, an error such as a short circuit may frequently occur between the electrodes and the nanoscale LED devices electrically connected to each other. Accordingly, a desired electrode assembly is not obtained.

Korean Patent Application No. 2010-0042321 discloses a structure of an address electrode line for an LED module and a method of manufacturing the same. In this application, an electrode line is manufactured by stacking a thin-film lower electrode on a substrate and then sequentially stacking an insulating layer and an upper electrode on the lower electrode, and then mounting an LED chip on the upper electrode. However, when the LED chip is a nanoscale chip, it is very difficult to exactly mount the LED chip, which is a 3D LED chip, on the upper electrode so that the LED chip may be arranged upright. Even after the LED chip is mounted, it is difficult to connect the mounted LED chip, which is a nanoscale chip, and the lower electrode.

Furthermore, when an LED device which is independently grown is arranged on an electrode and power is supplied to the electrode, contact resistance occurs between the LED device and the electrode, thereby decreasing light extraction efficiency.

SUMMARY OF THE INVENTION

To address the above-described problems, the present invention is directed to a nanoscale LED electrode assembly having improved electrical contacts, in which a conductive material is deposited on an interface between an LED device and an electrode to improve contact between the LED device and an electrode, thereby increasing conductivity between the LED device and the electrode and decreasing contact resistance, and a method of manufacturing the same.

According to an aspect of the present invention, a method of manufacturing a nanoscale light-emitting diode (LED) electrode assembly having improved electrical contacts includes (1) manufacturing a nanoscale LED electrode assembly by inducing self-alignment of nanoscale LED devices such that end parts of the nanoscale LED devices are connected to a first mounted electrode and a second mounted electrode formed to be spaced apart from each other and in parallel with a base substrate; (2) forming a photoresist layer on the nanoscale LED electrode assembly; (3) developing the photoresist layer to expose upper surfaces of the first mounted electrode and the second mounted electrode; and (4) forming a metal contact layer by depositing a metal on the nanoscale LED electrode assembly.

In one embodiment, between (1) and (2), the method may further include thermally processing the nanoscale LED electrode assembly at 200° C. to 1000° C. for 1 to 5 minutes.

In another embodiment, (2) may include forming a liftoff layer between an upper portion of the nanoscale LED electrode assembly and the photoresist layer, and (3) may include developing the liftoff layer and the photoresist layer to expose the upper surfaces of the first mounted electrode and the second mounted electrode such that side surfaces of the liftoff layer remaining after the developing of the liftoff layer and the photoresist layer are dented and thus a step is formed between the photoresist layer and the liftoff layer.

In another embodiment, a ratio between widths of the photoresist layer and the liftoff layer which remain after the developing of the liftoff layer and the photoresist layer may be in a range of 1:0.2 to 1:0.8.

In another embodiment, after (3), (4) may include forming the metal contact layer by depositing a metal on the nanoscale LED electrode assembly to bury a portion of the dented side surfaces of the liftoff layer.

In another embodiment, (3) may include developing the photoresist layer to additionally expose upper portions of opposite end parts of the nanoscale LED devices.

In another embodiment, (4) may include (4-1) forming the metal contact layer by depositing the metal on the nanoscale LED electrode assembly, as well as on an upper surface of the photoresist layer; and (4-2) lifting off the photoresist layer.

According to another aspect of the present invention, a method of manufacturing a nanoscale light-emitting diode (LED) electrode assembly having improved electrical contacts includes (1) manufacturing a nanoscale LED electrode assembly by inducing self-alignment of nanoscale LED devices such that end parts of the nanoscale LED devices are connected to a first mounted electrode and a second mounted electrode formed to be spaced apart from each other and in parallel with a base substrate; (2) forming a metal deposition layer on the nanoscale LED electrode assembly; (3) forming a photoresist layer on the metal deposition layer; (4) developing the photoresist layer to expose an upper surface of the metal deposition layer by removing at least a region of a part of the photoresist layer corresponding to a space between the first mounted electrode and the second mounted electrode; and (5) forming a metal contact layer by etching the metal deposition layer corresponding to the removed region of the photoresist layer.

In one embodiment, each of the nanoscale LED devices may include an insulating film provided on an outer surface of the nanoscale LED device, excluding opposite end parts thereof.

In another embodiment, the method may further include, between (1) and (2), thermally processing the nanoscale LED electrode assembly at 200° C. to 1000° C. for 1 to 5 minutes.

In another embodiment, (5) may include (5-1) forming the metal contact layer by etching the metal deposition layer to remove only a portion of the metal deposition layer corresponding to the removed region of the photoresist layer; and (5-2) removing the photoresist layer on the etched nanoscale LED electrode assembly.

In another embodiment, (5-1) may be performed by dry etching.

According to another aspect of the present invention, a nanoscale light-emitting diode (LED) electrode assembly having improved electrical contacts includes a base substrate; an electrode line including a first mounted electrode and a second mounted electrode formed to be spaced apart from each other and in parallel with the base substrate; a plurality of nanoscale LED devices of which end portions are connected to the first mounted electrode and the second mounted electrode; and a metal contact layer including a region corresponding to interfaces between the first and second mounted electrodes and the nanoscale LED devices, the metal contact layer being formed to cover upper surfaces of the first and second mounted electrodes.

In one embodiment, the metal contact layer may have a thickness of 80 to 400 nm with respect to upper surfaces of the first and second mounted electrodes.

In another embodiment, the plurality of nanoscale LED devices may include a first mounted electrode layer and a second mounted electrode layer provided on opposite end parts of the respective nanoscale LED devices.

In another embodiment, each of the nanoscale LED devices may include an insulating film provided on an outer surface of the nanoscale LED device, excluding opposite end parts thereof.

As used herein, the expressions "first mounted electrode" and "second mounted electrode" should be understood to include either electrode regions on which a nanoscale LED device can actually be mounted or electrode regions which may be further provided according to a method of arranging electrodes on a base substrate, as well as the electrode regions. However, a nanoscale LED electrode assembly according to the present invention should be understood to mean an electrode region on which a nanoscale LED device can be actually mounted.

The term "end part" should be understood to include a portion of an outer surface of a nanoscale LED device which is connected to an end of the nanoscale LED device.

When each layer, region, pattern, or structure is referred to as being formed "on", "above", "under", or "below" a substrate or another layer, region, or pattern, the terms "on", "above', "under", and 'below" should be understood to include "directly" and "indirectly".

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIGS. 1A-1F are perspective views illustrating a process of manufacturing an electrode line according to an embodiment of the present invention;

DETAILED DESCRIPTION OF EMBODIMENTS

Figure 2:
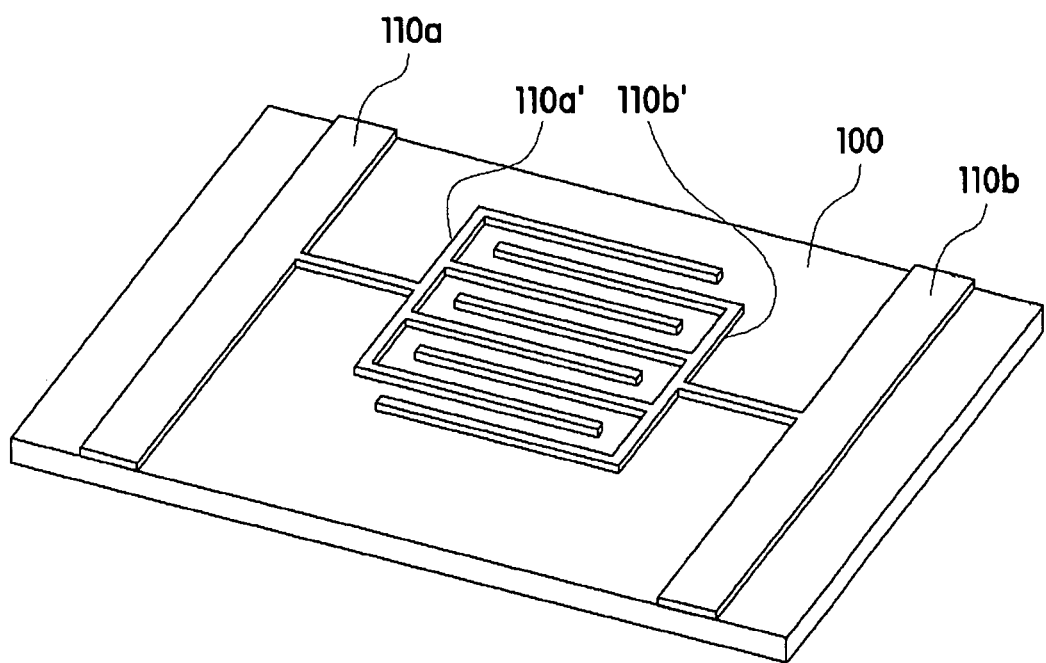
FIG. 2 is a perspective view of an electrode line having a first mounted electrode and a second mounted electrode formed on a base substrate, according to an embodiment of the present invention.

Hereinafter, the present invention will be described in detail below with reference to the accompanying drawings.

As described above, in a method of separately and independently growing LED devices and arranging the LED devices on electrodes, which is one of several methods of manufacturing an LED electrode assembly, LED devices independently grown using a separate process are individually arranged on patterned electrodes. In this method, when the independently grown LED devices are arranged on the electrodes and power is supplied to the electrodes, contact resistance occurs between the LED devices and the electrodes and thus light extraction efficiency may be low, thereby decreasing luminous efficiency.

Thus, in order to solve this problem, there is provided a method of manufacturing a nanoscale light-emitting diode (LED) electrode assembly having improved electrical contacts according to a first embodiment of the present invention, the method including (1) manufacturing a nanoscale LED electrode assembly by inducing self-alignment of nanoscale LED devices such that end parts of the nanoscale LED devices are connected to a first mounted electrode and a second mounted electrode formed to be spaced apart from each other and in parallel with a base substrate; (2) forming a photoresist layer on the nanoscale LED electrode assembly; (3) developing the photoresist layer to expose upper surfaces of the first mounted electrode and the second mounted electrode; and (4) forming a metal contact layer by depositing a metal on an upper portion of the nanoscale LED electrode assembly. Thus, conductivity between the LED devices and the electrode may be increased and a resistance value may be decreased by depositing a conductive material on interfaces between the LED devices and the electrodes, thereby greatly improving the light extraction efficiency of the LED devices.

First, in (1) of the method, a nanoscale LED electrode assembly is manufactured by inducing self-alignment of nanoscale LED devices such that end parts of the nanoscale LED devices are connected to a first mounted electrode and a second mounted electrode formed to be spaced apart from each other and in parallel with a base substrate. In detail, the nanoscale LED electrode assembly on which the first mounted electrode and the second mounted electrode are connected is manufactured by applying a dispersion solution including a dispersion solvent and nanoscale LED devices onto a surface of the base substrate on which an electrode line has been formed by forming the first mounted electrode and the second mounted electrode to be spaced apart from each other and then by inducing self-alignment of the nanoscale LED devices by supplying power to the electrode line.

First, a method of forming the electrode line on a surface of the base substrate will be described below. In detail, FIG. 1 is a perspective view illustrating a process of manufacturing an electrode line on a base substrate according to an embodiment of the present invention. However, a process of manufacturing an electrode line for nanoscale LED devices is not limited thereto.

First, referring to FIG. 1A, a glass substrate, a quartz substrate, a sapphire substrate, a plastic substrate, or a flexible polymer film may preferably be used as a base substrate 100 on which an electrode line is formed. More preferably, the base substrate 100 may be transparent. However, embodiments are not limited thereto and any type of substrate on which general electrodes can be formed may be used as the base substrate 100.

An area of the base substrate 100 is not limited, and is variable in consideration of an area of a first mounted electrode and an area of a second mounted electrode to be formed on the base substrate 100, sizes of nanoscale LED devices which communicate with the first mounted electrode and the second mounted electrode, and the number of the nanoscale LED devices. Preferably, the base substrate 100 may have a thickness of 100 μm to 1 mm, but is not limited thereto.

Next, as illustrated in FIG. 1B, a photoresist layer 101 may be formed by coating photoresist PR onto the base substrate 100. The photoresist may be one generally used in the art. The forming of the photoresist layer 101 by coating the photoresist onto the base substrate 100 may be performed by spin coating, spray coating, or screen printing and may preferably be performed by spin coating, but embodiments are not limited thereto. In detail, the forming of the photoresist layer 101 by coating the photoresist onto the base substrate 100 may be performed according to a method known in the present method. The photoresist layer 101 may have a thickness of 0.1 to 10 μm. However, the thickness of the photoresist layer 101 may vary according to thicknesses of electrodes to be deposited on the base substrate 100.

After the photoresist layer 101 is formed on the base substrate 100 as described above, a mask 102 on which patterns 102a and 102b, which correspond to the electrode line on which the first mounted electrode and the second mounted electrode are alternately arranged on the same plane so as to be spaced apart from each other (see FIG. 3), are drawn may be placed on the photoresist layer 101 to expose the mask 102 to UV rays by irradiating the UV rays onto the photoresist layer 101 as illustrated in FIG. 1C.

Next, the exposed photoresist layer 101 may be removed by immersing it into a conventional photoresist solvent, thereby removing portions of the exposed photoresist layer 101 on which the electrode line as illustrated in FIG. 1D is to be formed. A width of the pattern 102a corresponding to a first mounted electrode line corresponding to the electrode line may be 100 nm to 50 μm and a width of the pattern 102b corresponding to a second mounted electrode line corresponding to the electrode line may be 100 nm to 50 μm, but embodiments are not limited thereto.

Thereafter, as illustrated in FIG. 1E, an electrode forming material 103 may be deposited on the portions of the photoresist layer 101 which were removed in the form of the mask 102 for the electrode line. The electrode forming material 103 is a material for forming the electrode line including the first mounted electrode and the second mounted electrode spaced apart from the first mounted electrode. The first mounted electrode may include either at least one metal material selected from the group consisting of aluminum, titanium, indium, gold, and silver or at least one transparent material selected from the group consisting of an indium tin oxide (ITO), ZnO:Al, and a CNT-conductive polymer composite. When two or more types of electrode forming materials are used, the first mounted electrode may preferably have a stacked structure including two or more types of materials. More preferably, the first mounted electrode may have a stacked structure including two materials, e.g., titanium and gold. However, the first mounted electrode is not limited thereto.

The second mounted electrode formed of the electrode forming material 103 may include either at least one metal material selected from the group consisting of aluminum, titanium, indium, gold, and silver or at least one transparent material selected from the group consisting of an ITO, ZnO:Al, and a CNT-conductive polymer composite. When the electrode forming material 103 includes two or more types of materials, the second mounted electrode may preferably have a stacked structure including two or more types of materials. More preferably, the second mounted electrode may have a stacked structure including two materials, e.g., titanium and gold. However, the second mounted electrode is not limited thereto.

Materials of the first mounted electrode and the second mounted electrode may be the same or different.

The electrode forming material 103 may be deposited by thermal deposition, e-beam deposition, sputtering deposition, or screen printing and may preferably be deposited by thermal deposition, but embodiments are not limited thereto.

After the electrode line including the first mounted electrode and second mounted electrode spaced apart from the first mounted electrode is formed by depositing the electrode forming material 103, an electrode line 110 including a first mounted electrode 110a and a second mounted electrode 110b (spaced apart from the first mounted electrode 110a) deposited on the base substrate 100 may be formed by removing the photoresist layer 101 coated on the base substrate 100 using a photoresist remover which is acetone, 1-Methyl-2-pyrrolidone (NMP) or dimethyl sulfoxide (DMSO), as illustrated in FIG. 1F.

In the electrode line 110 according an embodiment of to the present invention manufactured described above, a unit electrode area, i.e., an area of a region in which two electrodes on which nanoscale LED devices are arranged are independently driven, may be preferably 1 μm$^2$ to 100 cm$^2$ and more preferably 10 μm$^2$ to 100 mm$^2$, but the unit electrode area is not limited thereto. The electrode line 110 may include one or more unit electrodes.

Furthermore, in the electrode line 110, a space between the first mounted electrode 110a and the second mounted electrode 110b may be equal to or less than a length of the nanoscale LED devices. Thus, a nanoscale LED device may be inserted horizontally between the first mounted electrode 110a and the second mounted electrode 110b or may communicate with the first mounted electrode 110a and the second mounted electrode 110b.

The first mounted electrode 110a and the second mounted electrode 110b spaced apart from the first mounted electrode 110a which are formed on the same plane and on which nanoscale LEDs may be mounted are applicable as the electrode line 110 according to the present invention, as will be described below. An arrangement of the first mounted electrode 110a and the second mounted electrode 110b may vary according to a purpose thereof.

FIG. 2 is a perspective view of an electrode line for a first mounted electrode and a second mounted electrode formed on a base substrate, according to an embodiment of the present invention. First mounted electrodes 110a and 110a' and/or second mounted electrodes 110b and 110b' may be formed on a base substrate 100 The forming of the first mounted electrodes 110a and 110a' and/or the second mounted electrodes 110b and 110b' on the base substrate 100 should be understood to mean that at least one electrode among the first mounted electrodes 110a and 110a' and the second mounted electrodes 110b and 110b' are directly formed on a surface of the base substrate 100 or are formed to be spaced apart from an upper portion of the base substrate 100.

More specifically, referring to FIG. 2, all the first mounted electrodes 110a and 110a' and the second mounted electrodes 110b and 110b' are directly formed on a surface of the base substrate 100 such that the first mounted electrode 110a' and the second mounted electrode 110b' are alternately arranged on the same plane to be spaced apart from each other.

Figure 3:
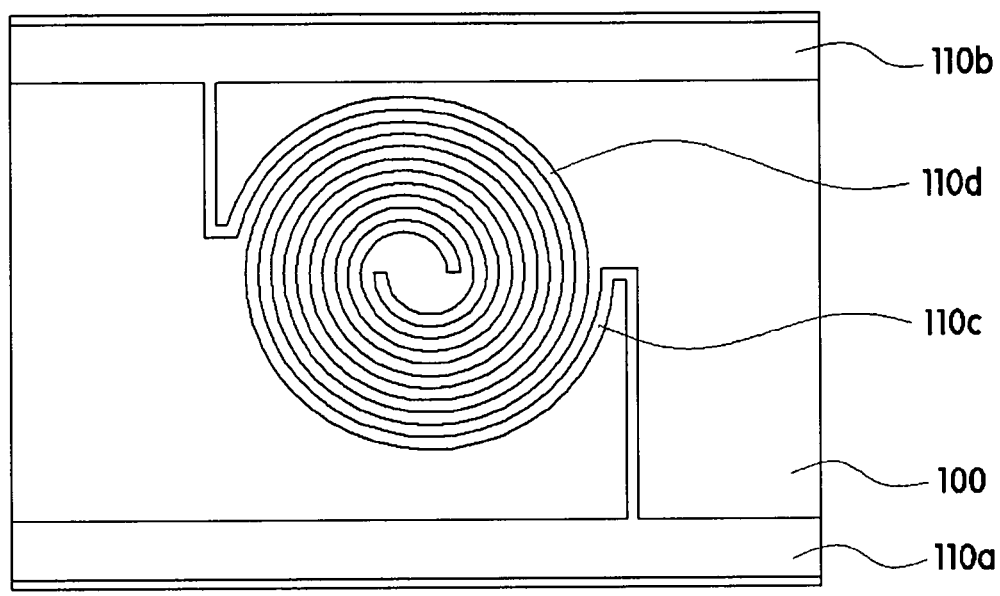
FIG. 3 is a plan view of an electrode line having a first mounted electrode and a second mounted electrode formed on a base substrate, according to an embodiment of the present invention.

FIG. 3 is a plan view of an electrode line for a first mounted electrode and a second mounted electrode formed on a base substrate, according to an embodiment of the present invention. All first mounted electrodes 110a and 110c and second mounted electrodes 110b and 110c are directly formed on a surface of a base substrate 100 such that the first mounted electrode 110c and the second mounted electrode 110d are arranged in a spiral form on the sample plane so as to be spaced apart from each other.

As described above, when an electrode line is configured such that a first mounted electrode and a second mounted electrode are alternately arranged or arranged in a spiral form, nanoscale LED devices included in a limited area of the base substrate 100 may be arranged at a time, and thus an area for driving unit electrodes which may be independently driven may be enlarged. Accordingly, the number of nanoscale LED devices mountable on a unit electrode may be increased. In this case, the intensity of light emitted from LEDs per unit area increases and thus the electrode line is applicable to various types of photoelectric conversion devices requiring high brightness per unit area.

FIGS. 2 and 3 are merely examples, and thus embodiments are not limited thereto and two electrodes may be arranged in other various forms, provided that the two electrodes are spaced apart from each other.

According to another embodiment of the present invention, a second mounted electrode may be formed to be spaced apart from an upper portion of a base substrate, unlike the electrode lines of FIG. 2 according to embodiments of the present invention.

Figure 4:
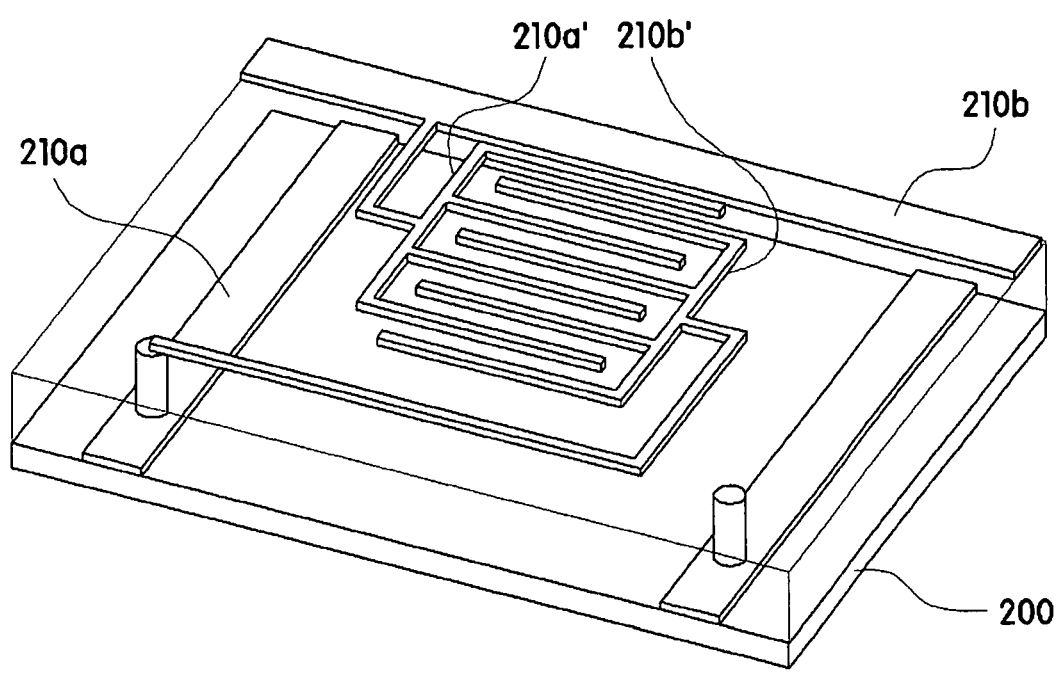
FIG. 4 is a perspective view of an electrode line having a first mounted electrode and a second mounted electrode formed on a base substrate, according to another embodiment of the present invention.

FIG. 4 is a perspective view of an electrode line for a first mounted electrode and a second mounted electrode formed on a base substrate, according to another embodiment of the present invention. First mounted electrodes 210a and 210a' are directly formed on a surface of a base substrate 200 but second mounted electrodes 210b and 210b' are formed to be spaced apart from an upper portion of the base substrate 200. The first mounted electrode 210a' and the second mounted electrode 210b' may be alternately arranged on the same plane so as to be spaced apart from each other.

A shape in which a first mounted electrode and a second mounted electrode are alternately arranged on the sample plane will be described below. The first mounted electrode and the second mounted electrode may be formed directly on a surface of a base substrate or may be formed to be spaced apart from the surface of the base substrate. Alternatively, the first mounted electrode and the second mounted electrode may not be arranged on the same plane.

Next, a plurality of nanoscale LED devices arranged on a surface of an electrode line will be described below.

The plurality of nanoscale LED devices may be included in a dispersion solution. The dispersion solution including the plurality of nano scale LED devices and a dispersion solvent may be prepared by mixing the plurality of nanoscale LED devices with the dispersion solvent. The dispersion solvent may be in the form of ink or paste. The dispersion solvent may preferably include at least one material selected from the group consisting of acetone, water, alcohol, and toluene, and may more preferably include acetone. However, the type of the dispersion solvent is not limited thereto, and any type of solvent may be used, provided that it can easily evaporate without physically and chemically influencing the nanoscale LED devices.

Preferably, 0.001 to 100 parts by weight of the nanoscale LED devices may be included with respect to 100 parts by weight of the dispersion solvent. If less than 0.001 parts by weight of the nanoscale LED devices are included, the number of nanoscale LED devices communicating with the electrodes is small and thus a nanoscale LED electrode assembly may be difficult to operate normally. To solve this problem, the dispersion solution should be added several times. If more than 0.001 parts by weight of the nanoscale LED devices are included, it may be difficult to align the nanoscale LED devices to each other.

The type of nanoscale LED devices applicable to the present invention is not limited, provided that they can be used for a lighting or a display. A length of the nanoscale LED devices may preferably be 100 nm to 10 μm, and more preferably, may be 500 nm to 5 μm. The efficiency of the nanoscale LED devices may be low when the length of the nanoscale LED devices is less than 100 nm, and the luminous efficiency of the nanoscale LED devices may be low when the length of the nanoscale LED devices is greater than 10 μm. The nanoscale LED devices may have various shapes, e.g., a cylindrical shape, a cuboid shape, etc. and preferably have a cylindrical shape, but are not limited thereto.

Korean Patent Application No. 2011-0040174 of the inventor of the present application may be referred to for a nanoscale LED device according to an embodiment of the present invention.

In the following description of a nanoscale LED device, the terms 'on', 'below', 'above', 'under', 'upper portion' and 'lower portion' should be understood to cover an upward direction and a downward direction with respect to each layer included in the nanoscale LED device.

The nanoscale LED device may include a first mounted electrode layer, a first conductive semiconductor layer formed on the first mounted electrode layer, an active layer formed on the first conductive semiconductor layer, a second conductive semiconductor layer formed on the active layer, and a second mounted electrode layer formed on the second conductive semiconductor layer.

Figure 5:
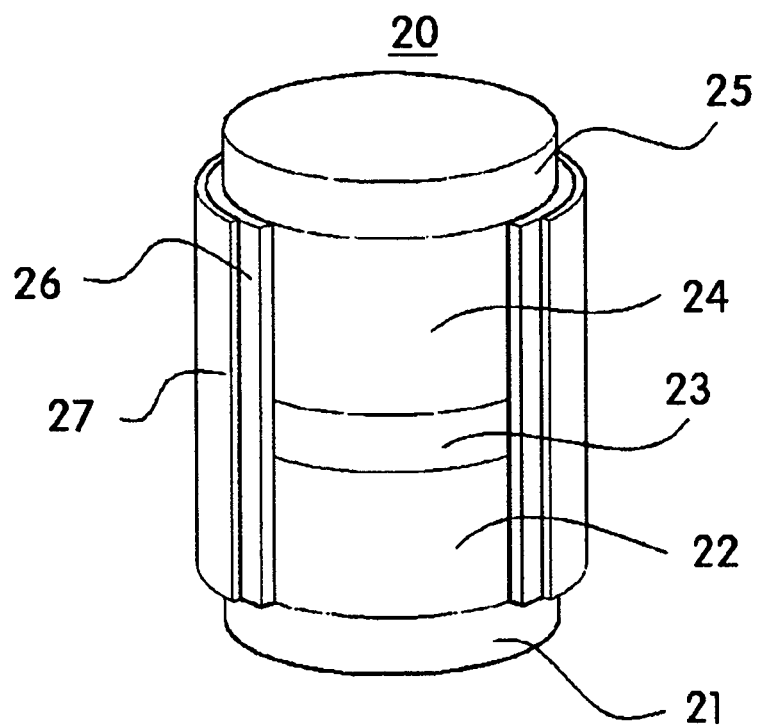
FIG. 5 is a perspective view of a nanoscale light-emitting diode (LED) device according to an embodiment of the present invention.

FIG. 5 is a perspective view of a nanoscale LED device according to an embodiment of the present invention. A nanoscale LED device 20 includes a first mounted electrode layer 21, a first conductive semiconductor layer 22 formed on the first mounted electrode layer 21, an active layer 23 formed on the first conductive semiconductor layer 22, a second conductive semiconductor layer 24 formed on the active layer 23, and a second mounted electrode layer 25 formed on the second conductive semiconductor layer 24.

First, the first mounted electrode layer 21 will be described below.

The first mounted electrode layer 21 may include a metal or a metal oxide used for an electrode of a general LED device and preferably includes chromium (Cr), titanium (Ti), aluminum (Al), gold (Au), nickel (Ni), an ITO, an oxide or alloy thereof, a conductive organic material, or a mixture thereof, but is not limited thereto. The first mounted electrode layer 21 may preferably have a thickness of 1 to 100 nm, but is not limited thereto.

Next, the first conductive semiconductor layer 22 formed on the first mounted electrode layer 21 will be described.

The first conductive semiconductor layer 22 may include, for example, an n type semiconductor layer. When the nanoscale LED device 20 is a blue-light emitting device, the n type semiconductor layer may include a semiconductor material having an empirical formula of $In_xAl_yGa_{1-x-y}N$ ($0 \leq x \leq 1$, $0 \leq y \leq 1$, $0 \leq x+y \leq 1$), for example, at least one material selected from the group consisting of InAlGaN, GaN, AlGaN, InGaN, AN, InN, etc., and may be doped with a first conductive dopant (e.g., Si, Ge, Sn, or the like). Preferably, a thickness of the first conductive semiconductor layer 22 may be 500 nm to 5 μm, but is not limited thereto. However, light emitted from the nanoscale LED device 20 is not limited to blue light. When the color of light emitted from the nanoscale LED device 20 is not blue, a different type of a Group III-V semiconductor material may be used as the n type semiconductor layer, but embodiments are not limited thereto.

Next, the active layer 23 formed on the first conductive semiconductor layer 22 will be described. When the nanoscale LED device 20 is a blue-light emitting device, the active layer 23 is formed on the first conductive semiconductor layer 22 and may have a single or multi-quantum well structure. A clad layer (not shown) doped with a conductive dopant may be formed on and/or below the active layer 23. The clad layer doped with the conductive dopant may be an AlGaN layer or an InAlGaN layer. In addition, a material such as AlGaN or AlInGaN may be used as the active layer 23. When an electric field is applied to the active layer 23, light is generated from the combination of pairs of electrons and holes. Preferably, a thickness of the active layer 23 may be 10 to 200 nm, but is not limited thereto. A position of the active layer 23 may vary according to the type of the nanoscale LED device 20. However, light emitted from the nanoscale LED device 20 is not limited to blue light. When the color of light emitted from the nanoscale LED device 20 is not blue, a different type of a Group III-V semiconductor material may be used as the active layer 23, but embodiments are not limited thereto.

Next, the second conductive semiconductor layer 24 formed on the active layer 23 will be described. When the nanoscale LED device 20 is a blue-light emitting device, the second conductive semiconductor layer 24 may be formed on the active layer 23. The second conductive semiconductor layer 24 may be embodied as at least one p type semiconductor layer. The p type semiconductor layer may include a semiconductor material having an empirical formula of $In_xAl_yGa_{1-x-y}N$ ($0 \leq x \leq 1$, $0 \leq y \leq 1$, $0 \leq x+y \leq 1$), for example, at least one material selected from the group consisting of InAlGaN, GaN, AlGaN, InGaN, AN, InN, etc., and may be doped with a second conductive dopant (e.g., Mg). Here, a light-emitting structure may include, as a minimum number of components, the first conductive semiconductor layer 222, the active layer 23, and the second conductive semiconductor layer 24, and may further include a phosphor layer, an active layer, a semiconductor layer, and an electrode layer provided on or below each of these layers. Preferably, a thickness of the second conductive semiconductor layer 24 may be 50 nm to 500 nm, but is not limited thereto. Light emitted from the nanoscale LED device 20 is not limited to blue light. When the color of light emitted from the nanoscale LED device 20 is not blue, a different type of Group III-V semiconductor material may be used as the p type semiconductor layer, but embodiments are not limited thereto.

Next, the second mounted electrode layer 25 formed on the second conductive semiconductor layer 24 will be described.

The second mounted electrode layer 25 may include a metal or a metal oxide used for an electrode of a general LED device and preferably includes chromium (Cr), titanium (Ti), aluminum (Al), gold (Au), nickel (Ni), an ITO, an oxide or alloy thereof, a conductive organic material, or a mixture thereof, but is not limited thereto. Preferably, a thickness of the second mounted electrode layer 25 may be 1 to 100 nm, but is not limited thereto.

The nanoscale LED device 20 may include an insulating film 26 on an outer surface thereof. In detail, the insulating film 26 may be provided to coat the entire outer surface of the active layer 23. Preferably, an outer surface of at least one of the first conductive semiconductor layer 22 and the second conductive semiconductor layer 24 may be coated with the insulating film 26 to prevent a decrease in the durability of the nanoscale LED device due to damage to the outer surface of at least one of the first conductive semiconductor layer 22 and the second conductive semiconductor layer 24.

In the method according to the first embodiment, the insulating film 26 may prevent the occurrence of a short circuit caused when the active layer 23 of the nanoscale LED device 20 and an electrode line included in an nanoscale LED electrode assembly are in contact with each other. Furthermore, the insulating film 26 may protect the outer surface of the active layer 23 of the nanoscale LED device 20 to prevent the occurrence of a surface defect on the active layer 23, thereby preventing a decrease in luminous efficiency and durability.

Next, in (2) of the method, a photoresist layer is formed on the nanoscale LED electrode assembly.

Figure 6:
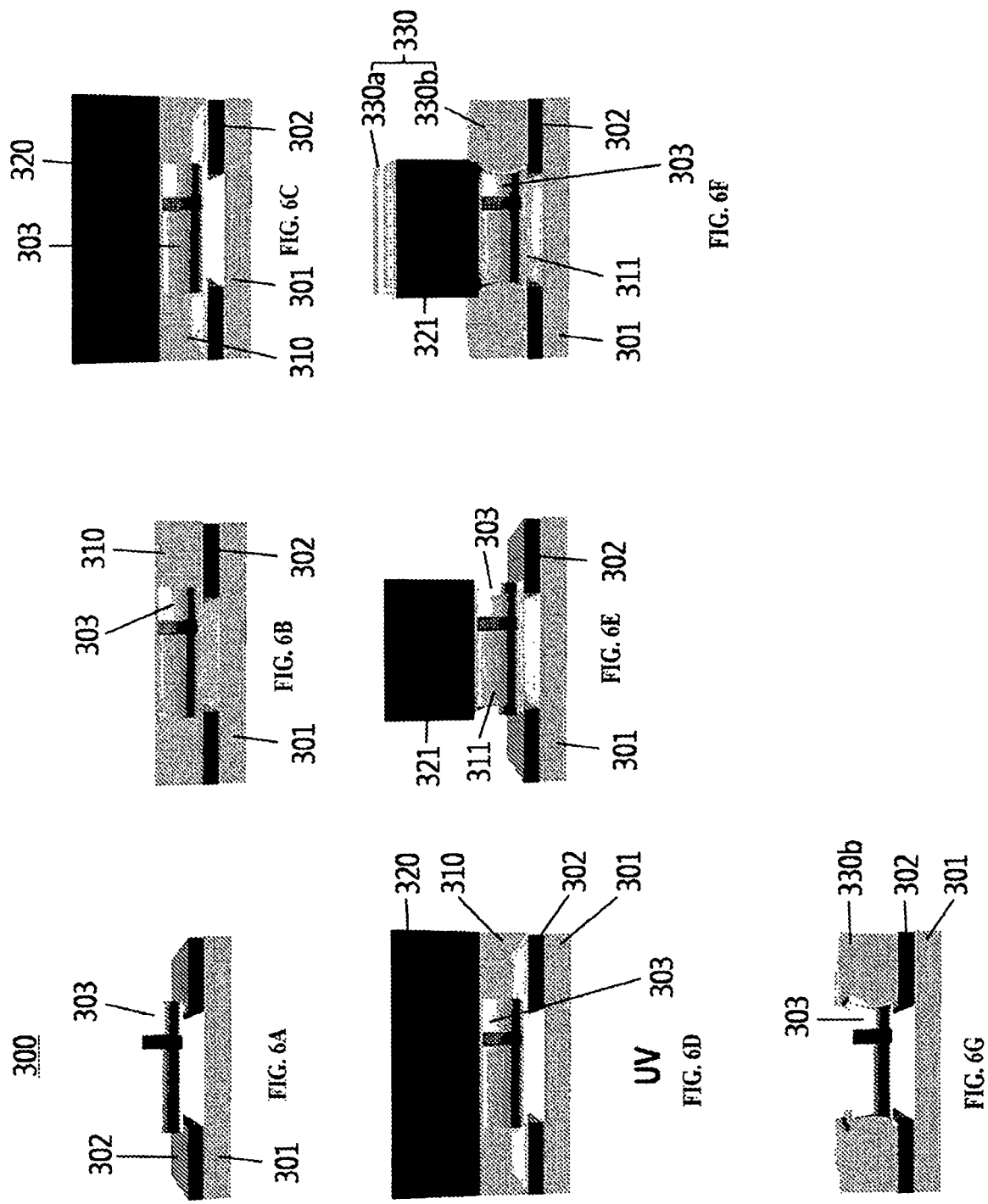
FIGS. 6A-6G are cross-sectional views of a process of forming a metal contact layer according to an embodiment of the present invention.

First, a method of forming a photoresist layer on a nanoscale LED electrode assembly will be described. FIG. 6 is a cross-sectional view of a process of forming a metal contact layer according to an embodiment of the present invention.

FIG. 6A illustrates a nanoscale LED electrode assembly 300 including a nanoscale LED device 303 connected to an electrode line 302 formed on a base substrate 301. As illustrated in FIG. 6C, a photoresist layer 320 may be formed on the nanoscale LED electrode assembly 300 including the nanoscale LED device 303 connected to the electrode line 302.

A photoresist is a resin which chemically changes when light is emitted thereupon, and is classified into a positive photoresist and a negative photoresist. A positive photoresist is a photosensitive resin of which only a portion exposed to light of a polymeric material is solubilized and disappears. A negative photoresist is a photosensitive resin of which only a portion exposed to light of a polymeric material is insolubilized and remains.

The photoresist layer 320 may be a layer selected from among a positive photoresist layer and a negative photoresist layer, and is preferably the negative photoresist layer to simplify processing.

The photoresist layer 320 may be coated using a general coating method. Preferably, the photoresist layer 320 may be coated by spin-coating at 300 to 4000 rpm for 3 to 50 seconds. When the photoresist layer 320 is coated at less than 300 rpm, the photoresist layer 320 may not be coated. When the photoresist layer 320 is coated at more than 4000 rpm, the photoresist layer 320 may become extremely thin and thus lifting off may not be completely achieved. If the photoresist layer 320 is coated for less than 3 seconds, the photoresist layer 320 may not be evenly formed. If the photoresist layer 320 is coated for more than 50 seconds, the photoresist layer 320 may become extremely thin and lifting off may not be completely achieved. However, a speed and time of spin-coating the photoresist layer 320 may vary according to the type of photoresist and are thus not limited thereto.

After the photoresist layer 320 is coated, the coated photoresist layer 320 may be soft-baked at 70 to 110° C. for 1 to 5 minutes, thereby completing the forming of the coated photoresist layer 320. When a soft-baking temperature is less than 70° C., exposure equipment and a mask may become contaminated due to a residual solvent contained in the formed photoresist layer 320. When the soft-baking temperature is greater than 110° C., the photoresist layer 320 may be modified or photoresist reaction characteristics may not be kept constant. Thus, a desired pattern cannot be formed. When a soft-baking time is less than 1 minute, exposure equipment and a mask may become contaminated due to the residual solvent contained in the formed photoresist layer 320. When the soft-baking time is greater than 5 minutes, the photoresist layer 320 may be modified or photoresist reaction characteristics may not be kept constant. Thus, a desired pattern cannot be formed. However, the soft-baking temperature and time may vary according to the type of photoresist and are thus not limited thereto.

A ratio of a thickness of the soft-baked photoresist layer 320 to a diameter of the nanoscale LED device 303 may be in a range of 1:1.5 to 1:20. If the ratio of the thickness of the soft-baked photoresist layer 320 to the diameter of the nanoscale LED device 303 is less than 1:1.5, a photoresist pattern may become covered with a metal contact layer which will be described below and thus lifting off may not be completely achieved. If the ratio of the thickness of the soft-baked photoresist layer 320 to the diameter of the nanoscale LED device 303 is greater than 1:20, it may be difficult to form the metal contact layer.

In (2) of the method, a liftoff layer may be further formed between an upper portion of the nanoscale LED electrode assembly and the photoresist layer 320. In detail, a liftoff layer 310 may be formed on the nanoscale LED electrode assembly 300 as illustrated in FIG. 6B. The liftoff layer forms a step with the above-described photoresist layer after (3) of the method which will be described below. Thus, electrical contacts of electrical nanoscale LED devices connected to side surfaces of the first and second mounted electrodes may be improved, as will be described in detail with respect to (4) of the method below. Furthermore, since the liftoff layer 310 forms the step, the liftoff layer may be more easily lifted off in (4) of the method which will be described below.

The liftoff layer 310 may be coated according to a general coating method. Preferably, the liftoff layer 310 may be coated by spin coating at 300 to 5000 rpm for 3 to 50 seconds. The liftoff layer 310 may not be easily coated when the liftoff layer 310 is coated at less than 300 rpm, and may become extremely thin when the liftoff layer 310 is coated at more than 5000 rpm. The liftoff layer 310 may not be evenly coated when the liftoff layer 310 is coated for less than 3 seconds, and may become extremely thin when the liftoff layer 310 is coated for more than 50 seconds.

After the liftoff layer 310 is coated, the liftoff layer 310 may be soft-baked at 130 to 180° C. for 2 to 10 minutes, thereby completing the forming of the liftoff layer 310. When a soft-baking temperature is less than 130° C., the coated liftoff layer 310 may not be hardened and may become completely removed when the photoresist layer 320 is developed. When the soft-baking temperature is greater than 180° C., the liftoff layer 310 may be over-hardened or modified, and thus a liftoff pattern may not be easily formed due to a developing solution. When a soft-baking time is less than 2 minutes, the coated liftoff layer 310 may not be easily hardened and may thus become completely removed when the photoresist layer 320 is developed. When the soft-baking time is greater than 10 minutes, the liftoff layer 310 may be over-hardened or modified, and thus a liftoff pattern may not be easily formed due to the developing solution.

A ratio of a thickness of the soft-baked liftoff layer 310 to the diameter of the nanoscale LED device 303 may be in a range of 1:1 to 1:2. When the ratio of the thickness of the soft-baked liftoff layer 310 to the diameter of the nanoscale LED device 303 is less than 1:1, the nanoscale LED device 303 is not completely covered with the liftoff layer 310, and thus lifting off may be difficult to perform. When the ratio of the thickness of the soft-baked liftoff layer 310 to the diameter of the nanoscale LED device 303 is greater than 1:2, a photoresist pattern may not be easily formed even when exposure is performed for the same amount of time during rear-surface exposure, which will be described below.

According to an embodiment of the present invention, before (2) of the method, the method may further include thermally processing the nanoscale LED electrode assembly manufactured in (1) of the method at 200 to 1000° C., preferably at 300 to 800° C., for 1 to 5 minutes. Thermally processing of the nanoscale LED electrode assembly may be performed using a rapid thermal annealing (RTA) process. Through the RTA process, the dopants of the nanoscale LED device may be activated and a resistance value of an electrode which may be further provided at an end of the nanoscale LED device may be lowered, thereby decreasing a resistance value of the entire nanoscale LED device. Accordingly, a nanoscale LED electrode assembly having improved electrical contacts may be manufactured. However, since a semiconductor device is greatly influenced by a spatial distribution of dopants, dopant atoms are diffused when a thermal processing time is long, and thus exceed a desired distribution range. Accordingly, the RTA process is preferably performed as thermal processing to minimize movement of dopant atoms in a semiconductor during thermal processing.

Next, in (3) of the method according to the first embodiment of the present invention, the photoresist layer is developed to expose the upper surfaces of the first mounted electrode and the second mounted electrode.

The photoresist layer may be developed using two methods to expose the upper surfaces of the first mounted electrode and the second mounted electrode: a back exposure method and a direct lithography method.

First, the back exposure method will be described. In detail, as illustrated in FIG. 6D, the photoresist layer 320 may be developed using the back exposure method such that upper surfaces of a first mounted electrode and a second mounted electrode are exposed. More specifically, when the back exposure method is used, the photoresist layer 320 may be a negative photoresist layer, and UV rays may be irradiated onto the bottom of the nanoscale LED electrode assembly 300 such that regions of the liftoff layer 310 and the photoresist layer 320 exposed to the UV rays may be insolubilized. The UV rays may be irradiated for 3 to 30 seconds. After the UV rays are irradiated, thermal processing may be performed at 90 to 130° C. for 1 to 2 minutes. If the UV rays are irradiated for less than 3 seconds, not all of the exposed regions are insolubilized. If the UV rays are irradiated for more than 30 seconds, the exposed regions may extend to the photoresist layer 320 on the first mounted electrode and the second mounted electrode, thereby preventing enhancement of electrical contacts. However, an UV irradiation time may vary according to the amount of UV rays, and thus embodiments are not limited thereto. When thermal processing temperature is less than 90° C., the photoresist layer 320 may become removed due to the developing solution, regardless of UV exposure. When thermal processing temperature is greater than 130° C., the photoresist layer 320 may be over-hardened or modified, and may thus be difficult to develop. When a thermal processing time is less than 1 minute, the photoresist layer 320 may become removed due to the developing solution, regardless of UV exposure. When a thermal processing time is greater than 2 minutes, the photoresist layer 320 may be over-hardened or modified and may thus be difficult to develop.

Figure 7:
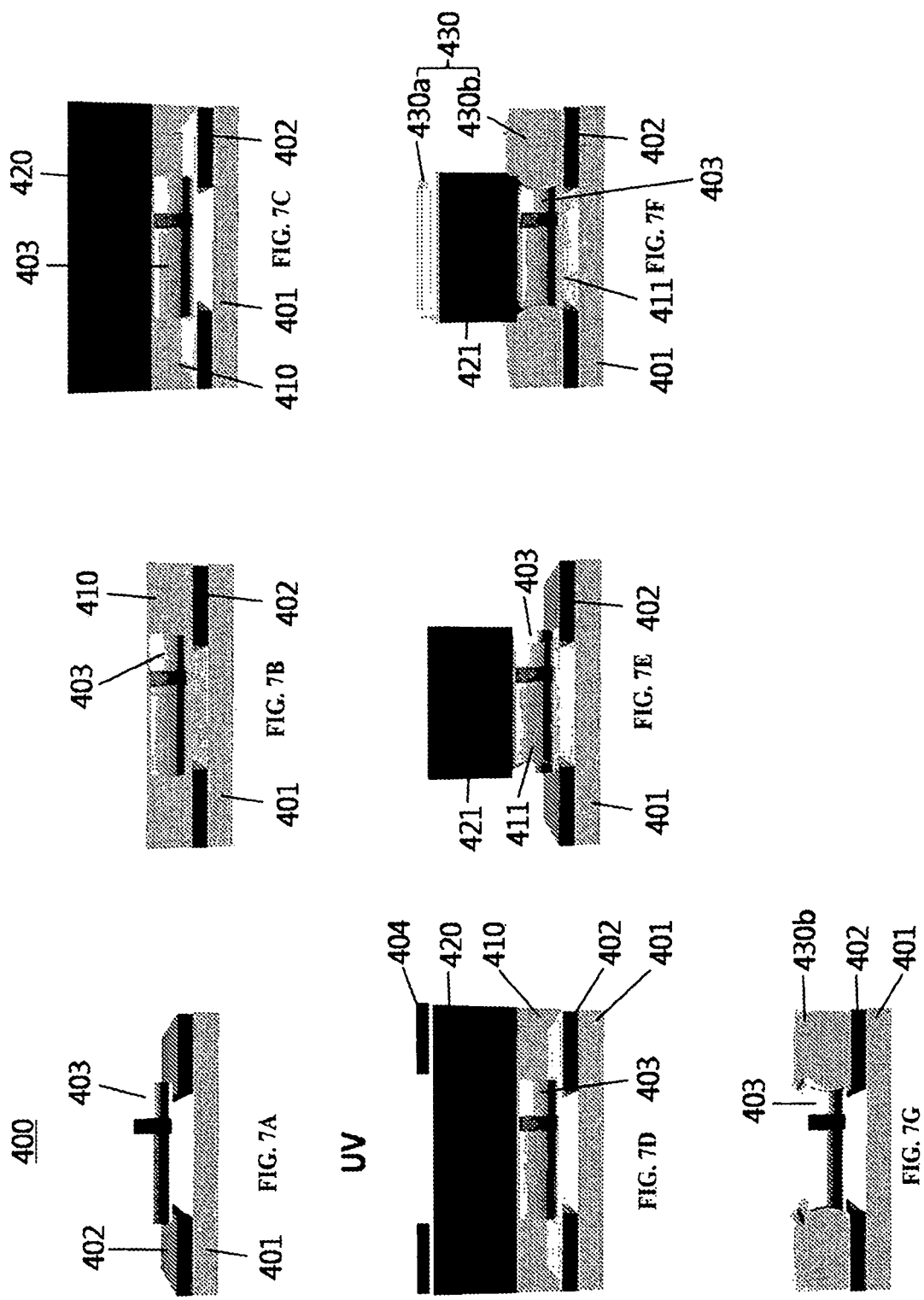
FIGS. 7A-7G are cross-sectional views of a process of forming a metal contact layer according to another embodiment of the present invention.

Next, the direct lithography method will be described. FIG. 7 is a cross-sectional view of a process of forming a metal contact layer according to another embodiment of the present invention. Unlike in the back exposure method described above with reference to FIG. 6D, UV rays may be irradiated using the direct lithography method as illustrated in FIG. 7D. Referring to FIG. 7D, a negative photoresist is used as a photoresist layer 420, and UV rays are irradiated using the direct lithography method. A mask 404 having a width equal to or less than that of a mounted electrode 402 may be formed on the photoresist layer 420, and UV rays may be irradiated onto the mask 404 such that regions of a liftoff layer 410 and the photoresist layer 420 exposed to the UV rays may be insolubilized. When positive photoresist is used as the photoresist layer 420 and UV rays are irradiated using the direct lithography method, a mask (not shown) may be formed on the photoresist layer 420 differently from that in FIG. 7D. More specifically, a mask (not shown) corresponding to a space between a first mounted electrode (not shown) and a second mounted electrode (not shown) formed on a base substrate (not shown) may be formed on a photoresist layer (not shown), and UV rays may be irradiated onto the mask such that regions of a liftoff layer (not shown) and the photoresist layer exposed to the UV rays may be solubilized.

The UV rays may be irradiated for 3 to 30 seconds, and thermal processing may be thereafter performed at 90 to 130° C. for 1 to 3 minutes. When a UV irradiation time is less than 3 seconds, not all the exposed regions may be insolubilized. When the UV irradiation time is greater than 30 seconds, the exposed regions may extend to the photoresist layer on the first mounted electrode and the second mounted electrode, thereby preventing improvement of electrical contacts. However, the UV irradiation time may vary according to the amount of the UV rays and embodiments are not limited thereto. When thermal processing temperature is less than 90° C., the photoresist layer may be removed by a developing solution, regardless of UV exposure. When thermal processing temperature is greater than 130° C., the photoresist layer may be over-hardened or modified and may thus be difficult to develop. When a thermal processing time is less than 1 minute, the photoresist layer may be removed by the developing solution, regardless of UV exposure. When a thermal processing time is greater than 3 minutes, the photoresist layer may be over-hardened or modified and may thus be difficult to develop.

Thereafter, the liftoff layer 310 and the photoresist layer 320 may be developed as illustrated in FIG. 6E. In detail, the liftoff layer 311 and a resultant photoresist layer 321 may be developed such that upper surfaces of the first mounted electrode and the second mounted electrode are exposed. Among side surfaces of the resultant photoresist layer 321 and the liftoff layer 311 which remain after the liftoff layer 311 and the resultant photoresist layer 321 are developed, the side surface of the liftoff layer 311 may be dented such that a step may be formed between the resultant photoresist layer 321 and the liftoff layer 311.

The type of the developing solution used in (3) of the method is not limited, provided that the developing solution can be used in a general developing process. The developing solution may preferably be one selected from the group consisting of tetramethylammonium hydroxide (TMAH), tetraethylammonium hydroxide, tetrapropylammonium hydroxide, tetrabutylammonium hydroxide, methyltriethylammonium hydroxide, trimethylethylammonium hydroxide, dimethyl diethylammonium hydroxide, trimethyl(2-hydroxyethyl)ammoniumhydroxide, triethyl(2-hydroxyethyl)ammoniumhydroxide, dimethyl di(2-hydroxyethyl)ammoniumhydroxide, diethyl(2-hydroxyethyl)ammoniumhydroxide, methyl tri(2-hydroxyethyl)ammoniumhydroxide, ethyl tri(2-hydroxyethyl)ammoniumhydroxide, tetra(2-hydroxyethyl)ammoniumhydroxide, and potassium hydroxide (KOH), and more preferably, may be tetramethylammonium hydroxide (TMAH).

(3) of the method may be performed using the developing solution for 30 to 300 seconds, preferably for 60 to 240 seconds. When a developing time is less than 30 seconds, the liftoff layer 310 and the photoresist layer 320 may not be easily developed, and thus a pattern may thus be difficult to form. When the developing time is greater than 300 seconds, both the liftoff layer 310 and the photoresist layer 320 may become developed and removed, regardless of UV exposure.

Figure 10:
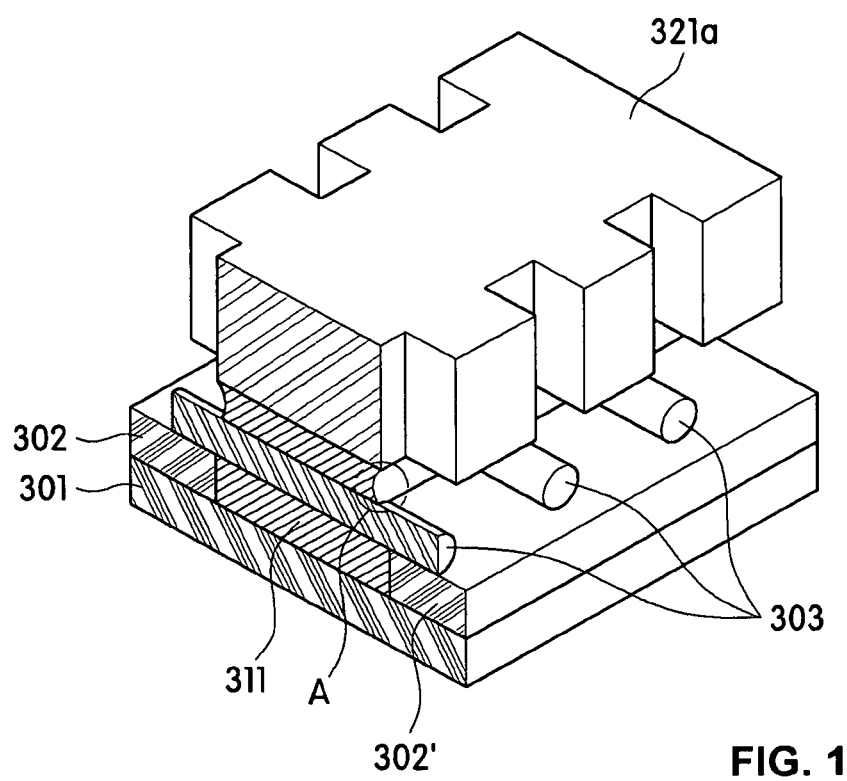
FIG. 10 is a perspective view of a nanoscale LED electrode assembly having a developed photoresist layer according to an embodiment of the present invention.

In (3) of the method, the resultant photoresist layer 321 may be developed to further expose the top of opposite end parts of the nanoscale LED device 303. FIG. 10 is a perspective view of a nanoscale LED electrode assembly having a developed photoresist layer according to an embodiment of the present invention. When (3) of the method is performed, a liftoff layer 311 and a photoresist layer 321a remain in a region between mounted electrodes 302 and 302', which are formed on a base substrate 301 to be spaced apart from other. Referring to FIG. 10, a plurality of nanoscale LED devices 303 are connected to the mounted electrode 302. The photoresist layer 321a on a region of the mounted electrode 302 to which the nanoscale LED devices 303 are connected is developed such that opposite end parts of the nanoscale LED devices 303 are further exposed. This is because during back exposure, UV rays arrive at and are absorbed by the nanoscale LED devices 303 earlier than at the photoresist layer 321a, and thus the amount of the UV rays irradiated onto the photoresist layer 321a on the electrodes on which the nanoscale LED devices 303 are located relatively decreases. Accordingly, the photoresist layer 321a is not insolubilized and is thus removed during the developing thereof. Thus, a metal contact layer may be more easily formed when a metal is deposited in (4) of the method.

Among the side surfaces of the photoresist layer 321a and the liftoff layer 311 which remain after the developing of the photoresist layer 321a, the side surface of the liftoff layer 311 may be dented such that a step A may be formed between the photoresist layer 321a and the liftoff layer 311. The step A will be described in detail with respect to (4) of the method which will be described below.

A ratio between widths of the photoresist layer 321a remaining after the developing thereof and the liftoff layer 311 having the step A may be in a range of 1:0.2 to 1:0.8. If the ratio between the widths of the remaining photoresist layer 321a and the liftoff layer 311 having the step is less than 1:0.2, the liftoff layer 311 may not withstand and a pattern may collapse. If the ratio between the widths of the remaining photoresist layer 321a and the liftoff layer 311 having the step is greater than 1:0.8, lifting off is not easily performed and contact characteristics of the nanoscale LED devices 303 mounted by being inserted between the side surfaces of first and second mounted electrodes cannot be improved.

The width of the liftoff layer 311 may be understood to mean a shortest width of the liftoff layer 311 having the step A.

Next, in (4) of the method, a metal contact layer is formed by depositing a metal on the nanoscale LED electrode assembly.

(4) of the method includes (4-1) forming a metal contact layer by depositing a metal on the nanoscale LED electrode assembly, as well as an upper surface of the photoresist layer, and (4-2) lifting off the photoresist.

First, in (4-1), in which the metal contact layer is formed by depositing a metal on the nanoscale LED electrode assembly, as well as the upper surface of the photoresist layer, a metal deposition layer 330 may be formed by burying a portion of a dented part of the liftoff layer 311 as illustrated in FIG. 6F. This is because a step is formed between the photoresist layer 321a and the liftoff layer 311 in (3) of the method as illustrated in FIG. 10. Thus, a metal contact layer may be more easily formed between mounted electrodes and nanoscale LED devices connected by being inserted between side surfaces of different mounted electrodes than when only the photoresist layer 321a is used without the liftoff layer 311. If the liftoff layer 311 is not included, the step A is not formed and thus a metal deposition layer (not shown) may difficult to form on the nanoscale LED electrode assembly, as well as on opposite end parts of the nanoscale LED devices 303 connected to the side surfaces of the mounted electrodes which are spaced apart from each other.

In detail, as the liftoff layer 311 is formed, electrical contacts of nanoscale LED devices connected to the side surfaces of the mounted electrodes, besides some other nanoscale LED devices, may be improved.

Figure 11:
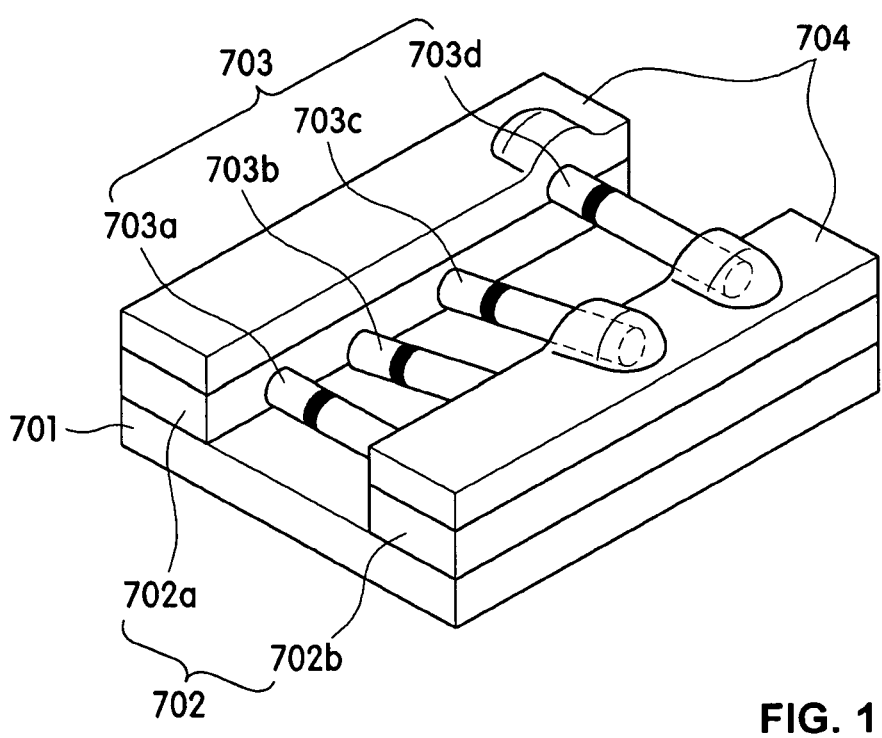
FIG. 11 is a perspective view of a nanoscale LED device connected to a first mounted electrode and a second mounted electrode according to an embodiment of the present invention.

FIG. 11 is a perspective view of a nanoscale LED device connected to a first mounted electrode and a second mounted electrode according to an embodiment of the present invention. In a nanoscale LED electrode assembly of FIG. 11, the alignment of a plurality of nanoscale LED devices 703a to 703d will now be described. The first nanoscale LED device 703a and the fourth nanoscale LED device 703d are aligned in parallel to each other such that they are perpendicular to mounted electrodes in a lengthwise direction. In contrast, the second nanoscale LED device 703b is connected to the mounted electrodes by being obliquely inserted into side surfaces of the mounted electrodes. Furthermore, the first nanoscale LED device 703a and the second nanoscale LED device 703b are connected to two different mounted electrodes by being inserted into the side surfaces of the two different mounted electrodes. In contrast, one end of the third nanoscale LED device 703c is connected to the side surface of one of the mounted electrodes and another end thereof is connected to an upper surface of the other mounted electrode, and opposite ends of the fourth nanoscale LED device 703d are connected to the upper surfaces of the two different mounted electrodes. Accordingly, the plurality of nanoscale LED devices 703a to 703d mounted on an electrode line are irregularly arranged. This is because the plurality of nanoscale LED devices 703a to 703d are physically micro-devices and thus cannot be individually and exactly mounted on a desired location on the electrode line in a desired direction with a machine or human hands. Furthermore, even according to a conventional method of the inventor of the present application, it is very difficult to directionally arrange all nanoscale LED devices in parallel.

In addition, as illustrated in FIG. 11, when a metal deposition layer 704 is formed only on a first mounted electrode 702a and a second mounted electrode 702b, the metal contact layer 704 is not formed on opposite end parts of nanoscale LED devices 703a and 703b connected to the side surfaces of two mounted electrodes 702. Thus, electrical contacts of only the nanoscale LED device 703d of which both opposite end parts are connected to the upper portions of the two mounted electrodes 702 may be improved. However, since in (3) of the method the liftoff layer is dented and the step is formed between the photoresist layer and the liftoff layer, the metal contact layer may be formed on the opposite end parts of the nanoscale LED devices connected to the side surfaces of the mounted electrodes in (4) of the method, unlike that shown in FIG. 11.

Next, in (4-2) in which the photoresist is lifted off, the liftoff layer 311 and the photoresist layer 321 formed on the liftoff layer 311 may be lifted off as illustrated in FIG. 6G. As illustrated in FIG. 10, as in (3) of the method, since the step A is formed between the photoresist layer 321a and the liftoff layer 311, the liftoff layer 311 may be more easily lifted off after the metal deposition layer 330 is formed in (4) of the method than when only the photoresist layer 321a is used without the liftoff layer 311. If the liftoff layer 311 is not included, the step A is not formed, and thus a metal deposition layer (not shown) formed on the upper surfaces of the photoresist layer 321a and the photoresist layer 321a may be difficult to lift off. In detail, in order to lift off photoresist layer 321a without the liftoff layer 311, the photoresist layer 321a should be formed in an inverted triangle shape such that a lower surface thereof is smaller in width that the upper surface thereof, but it is difficult to actually form a photoresist layer in an inverted triangle shape. Therefore, the remaining photoresist layer 321a cannot be easily lifted off.

In (4-2), in the metal deposition layer 330, a metal deposition layer 330a formed on the upper surface of the photoresist layer 321 when the liftoff layer 311 is lifted off is removed together with the liftoff layer 311 and the photoresist layer 321, and thus only a metal deposition layer 330b formed on the mounted electrode 302 remains, as well as the opposite end parts of the nanoscale LED device 303, as illustrated in FIG. 6B.

A method of manufacturing a nanoscale LED electrode assembly having improved electrical contacts according to a second embodiment of the present invention includes (1) manufacturing a nanoscale LED electrode assembly by self-aligning nanoscale LED devices such that end parts of the nanoscale LED devices are connected to a first mounted electrode and a second mounted electrode formed to be spaced apart from each other and in parallel with a base substrate, (2) forming a metal deposition layer on the nanoscale LED electrode assembly, (3) forming a photoresist layer on the metal deposition layer, (4) developing the photoresist layer by removing at least a region of a part of the photoresist layer corresponding to a space between the first mounted electrode and the second mounted electrode to expose an upper surface of the metal deposition layer, and (5) forming a metal contact layer by etching the metal deposition layer corresponding to the removed region of the photoresist layer.

Figure 8:
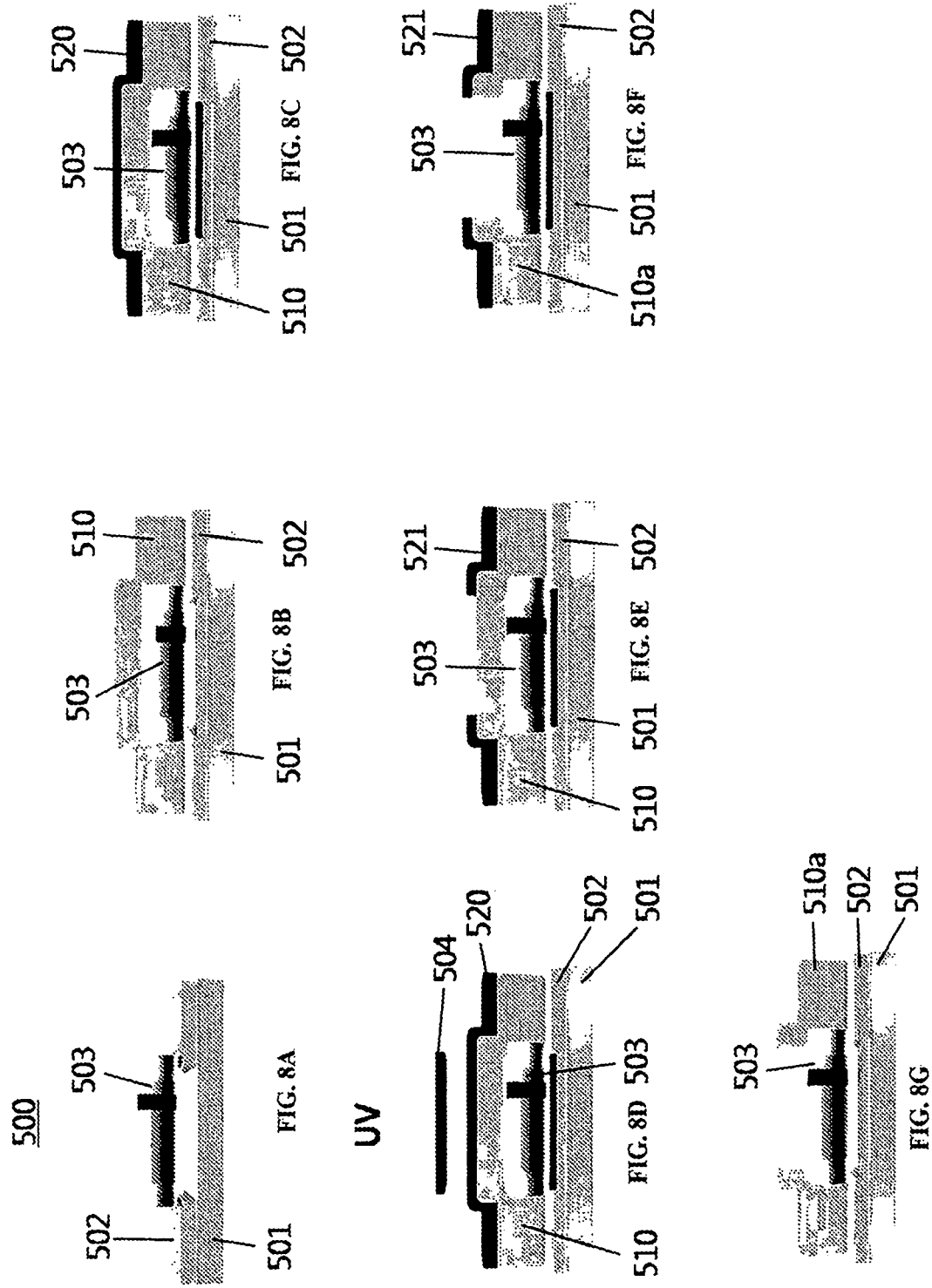
FIGS. 8A-8G are cross-sectional views of a process of forming a metal contact layer according to another embodiment of the present invention.

FIG. 8 is a cross-sectional view of a process of forming a metal contact layer according to another embodiment of the present invention. (1) of the above-described method illustrated in FIG. 8A is the same as (1) of the method according to the first embodiment described above and is thus not described again here.

Next, in (2), a metal deposition layer is formed on the nanoscale LED electrode assembly.

In the second embodiment of the present invention, after (1), the metal deposition layer is directly formed on the nanoscale LED electrode assembly without forming a photoresist layer, unlike in the first embodiment described above. This is because arranging and aligning nanoscale LED devices on mounted electrodes on the nanoscale LED electrode assembly manufactured in (1) depend on self-alignment of the nanoscale LED devices induced by supplying power. Accordingly, the nanoscale LED devices cannot be mechanically and uniformly arranged, and thus the metal contact layer is difficult to form exactly on a desired location.

In detail, FIG. 11 is a perspective view of a nanoscale LED device connected to a first mounted electrode and a second mounted electrode according to an embodiment of the present invention. In the nanoscale LED electrode assembly, the plurality of nanoscale LED devices 703a to 703d mounted on the electrode line are irregularly arranged. This is because the plurality of nanoscale LED devices 703a to 703d are physically micro-devices and thus cannot be individually and exactly mounted on a desired location on the electrode line in a desired direction with a machine or human hands. Furthermore, even according to the conventional method of the inventor of the present application, it is very difficult to directionally arrange all nanoscale LED devices in parallel.

Thus, in order to form the metal contact layer on opposite end parts of the nanoscale LED devices irregularly arranged as described above, the metal deposition layer is formed on the nanoscale LED electrode assembly after (1). When the metal deposition layer 704 is formed only on the first mounted electrode 702a and the second mounted electrode 702b as illustrated in FIG. 11, electrical contacts of only the fourth nanoscale LED device 703d of which the opposite end parts are connected to the upper portions of the mounted electrodes 702 may be improved, and the metal contact layer may not be formed on the first nanoscale LED devices 703a to the third nanoscale LED device 703c of which one end part or opposite end parts are connected to side surfaces of the mounted electrodes 702.

In detail, as illustrated in FIG. 8B, a metal deposition layer 510 is formed on an nanoscale LED electrode assembly 500 including a nanoscale LED device 503 connected to a mounted electrode 502 formed to be spaced apart from an upper portion of a base substrate 501. A metal which may be used to form the metal deposition layer 510 is not limited, provided that the metal can be generally used to deposit a metal. Preferably, at least one selected from the group consisting of titanium (Ti), gold (Au), chromium (Cr), and aluminum (Al) may be used to improve electrical contacts of the nanoscale LED electrode assembly.

In (2), the metal deposition layer is also formed on side surfaces of the nanoscale LED devices including an active layer. Thereafter, when there is residual metal electrically connecting a first conductive semiconductor layer and a second conductive semiconductor layer, a short circuit may occur in the electrodes. Thus, the nanoscale LED devices preferably include an insulating film.

In detail, as illustrated in FIG. 5, the nanoscale LED device 20 according to an embodiment of the present invention may include the insulating film 26 on the outer surface of the nanoscale LED device 20, excluding the opposite end parts thereof. In the method according to the second embodiment, the insulating film 26 of the nanoscale LED device 20 is capable of not only achieving the purpose according to the first embodiment described above but also of fundamentally preventing the occurrence of an electrical short circuit in the nanoscale LED device 20 caused when the metal deposition layer formed directly on the outer surface of the nanoscale LED device 20 in (2) is not etched to a desired level in (5) and may thus remain on the outer surface of the nanoscale LED device. In detail, after etching the metal deposition layer in (5), when there is residual metal connecting the first conductive semiconductor layer and the second conductive semiconductor layer of the nanoscale LED device, a short may occur in the electrodes. However, the insulating film 26 may prevent the occurrence of a short circuit.

Next, in (3) of the method, a photoresist layer 520 is formed on the metal deposition layer 510.

As illustrated in FIG. 8C, the photoresist layer 520 is formed on the metal deposition layer 510 formed in (2).

The photoresist layer 520 may be coated using a general coating method. Preferably, the photoresist layer 520 may be coated by spin coating at 300 to 4000 rpm for 3 to 50 seconds. When the photoresist layer 520 is coated at less than 300 rpm, the photoresist layer 520 may not be easily coated. When the photoresist layer 520 is coated at more than 4000 rpm, the photoresist layer 520 may become extremely thin, and thus lifting off may not be completely achieved. When the photoresist layer 520 is coated for less than 3 seconds, the photoresist layer 520 may not be evenly coated. When the photoresist layer 520 is coated for more than 50 seconds, the photoresist layer 520 may become extremely thin, and thus lifting off may not be completely achieved. However, a speed and time for spin-coating the photoresist layer 520 may vary according to the type of photoresist and are thus not limited thereto.

After the photoresist layer 520 is coated, the coated photoresist layer 520 may be hardened by soft baking it at 70 to 110° C. for 1 to 5 minutes.

If a soft-baking temperature is less than 70° C., exposure equipment and a mask may become contaminated due to a residual solvent contained in the photoresist layer 520. If the soft-baking temperature is greater than 110° C., the photoresist layer 520 may be modified or photoresist reaction characteristics may not be kept constant, thereby preventing a desired pattern from being formed. If a soft-baking time is less than 1 minute, exposure equipment and a mask may become contaminated due to the residual solvent contained in the photoresist layer 520. If the soft-baking time is greater than 5 minutes, the photoresist layer 520 may be modified or photoresist reaction characteristics may not be kept constant, thereby preventing a desired pattern from being formed. However, the soft-baking temperature and time may vary according to the type of photoresist and are thus not limited thereto.

A ratio between a thickness of the soft-baked photoresist layer 520 and a diameter of the nanoscale LED device 503 may be in a range of 1:1.5 to 1:20. If the ratio between the thickness of the soft-baked photoresist layer 520 and the diameter of the nanoscale LED device 503 is less than 1:1.5, the photoresist layer 520 is removed in a subsequent process of etching a metal contact layer. Thus, it is not possible for only the metal contact layer to be etched. If the ratio between the thickness of the soft-baked photoresist layer 520 and the diameter of the nanoscale LED device 503 is greater than 1:20, the modified photoresist layer 520 is difficult to remove in the subsequent process of etching a metal contact layer.

Next, in (4), the photoresist layer is developed by removing at least a region of a part of the photoresist layer corresponding to a space between the first mounted electrode and the second mounted electrode to expose an upper surface of the metal deposition layer.

In detail, when a negative photoresist layer is formed on the metal deposition layer 510, after hardening the photoresist layer 520 as described above, a mask 504 corresponding to a space between the first mounted electrode and the second mounted electrode may be formed on the photoresist layer 520 as illustrated in FIG. 8D, and UV rays are irradiated onto the mask 504 using the direct lithography method such that a region of the photoresist layer 520 exposed to the UV rays is insolubilized. The UV rays may be irradiated for 0.3 to 30 seconds, and preferably, 0.5 to 15 seconds. When a UV irradiation time is less than 0.3 seconds, the exposed region is completely insolubilized, and thus nanoscale LED devices may be exposed during the developing of the photoresist layer. When the UV irradiation time is greater than 30 seconds, the photoresist layer 520, which is not to be exposed to the UV rays using the mask 504, may also be exposed to the UV rays. However, the UV irradiation time may vary according to the amount of the irradiated UV rays and is thus not limited thereto.

Figure 9:
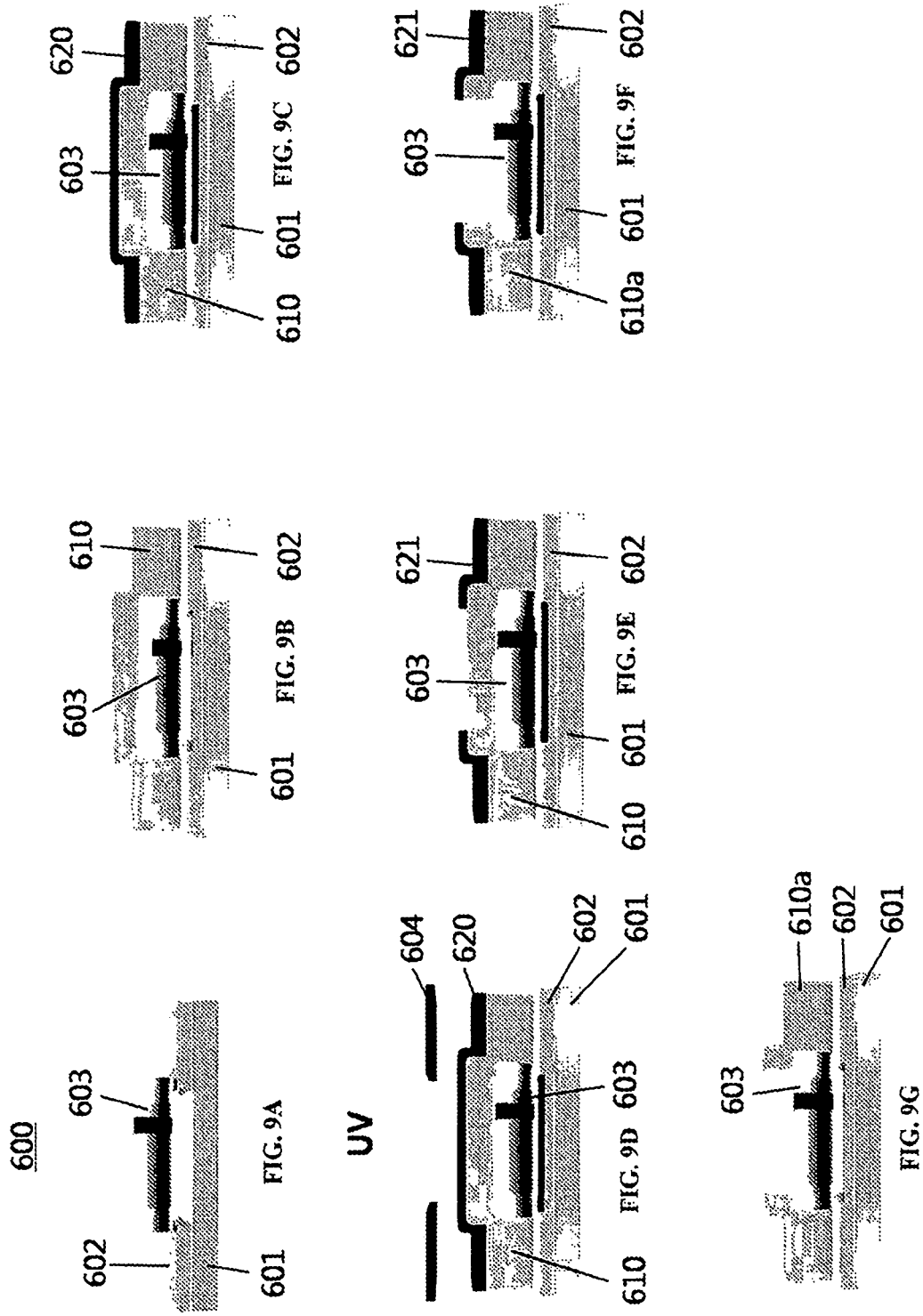
FIGS. 9A-9G are cross-sectional views of a process of forming a metal contact layer according to another embodiment of the present invention.

FIG. 9 is a cross-sectional view of a process of forming a metal contact layer according to another embodiment of the present invention. When a photoresist layer 620, which is a positive photoresist layer, is formed on a metal deposition layer, the photoresist layer 620 may be hardened as described above. Then, a mask 604 corresponding to a space between a first mounted electrode and a second mounted electrode may be formed on the photoresist layer 620 as illustrated in FIG. 9D, and UV rays are irradiated onto the mask 604 using the direct lithography method to solubilize a region of the photoresist layer 620 exposed to the UV rays. The UV rays may be irradiated for 0.5 to 30 seconds, and preferably, for 2 to 15 seconds. If a UV irradiation time is less than 0.5 seconds, the exposed region may not be completely solubilized, and thus a pattern is not formed. If the UV irradiation time is greater than 30 seconds, the exposed region extends to the photoresist layer 620 on the first mounted electrode and the second mounted electrode. Thus, a nanoscale LED device 603 may be exposed during developing of the photoresist layer 620.

Thereafter, as illustrated in FIG. 8E, the photoresist layer 520 may be developed. In detail, a portion of the photoresist layer 520 corresponding to the space between the first mounted electrode and the second mounted electrode may be developed and removed to obtain a resultant photoresist layer 521 remaining after the developing of the photoresist layer 520.

The type of a developing solution used in (4) of the method is not limited, provided that the developing solution can be used in a general developing process. The developing solution may be preferably one selected from the group consisting of tetramethylammonium hydroxide (TMAH), tetraethylammonium hydroxide, tetrapropylammonium hydroxide, tetrabutylammonium hydroxide, methyltriethylammonium hydroxide, trimethylethylammonium hydroxide, dimethyl diethylammonium hydroxide, trimethyl(2-hydroxyethyl)ammoniumhydroxide, triethyl(2-hydroxyethyl) ammoniumhydroxide, dimethyl di(2-hydroxyethyl)ammoniumhydroxide, diethyl(2-hydroxyethyl) ammoniumhydroxide, methyl tri(2-hydroxyethyl) ammoniumhydroxide, ethyl tri(2-hydroxyethyl) ammoniumhydroxide, tetra(2-hydroxyethyl) ammoniumhydroxide, and potassium hydroxide (KOH), and more preferably, may be tetramethylammonium hydroxide (TMAH).

When a negative photoresist layer is formed, a developing time may be 30 to 120 seconds, and preferably, may be 45 to 105 seconds. If the developing time is less than 30 seconds, the photoresist layer 520 may not be easily developed. If the developing time is greater than 120 seconds, the photoresist layer 520 may be over-developed, and thus the nanoscale LED device 503 may be influenced by the etching of a metal deposition layer, which will be described below.

When a positive photoresist layer is formed, the developing time may be 15 to 75 seconds, and preferably, may be 30 to 60 seconds. If the developing is performed for less than 15 seconds, the photoresist layer 620 may not be easily developed. If the developing is performed for more than 75 seconds, the photoresist layer 620 may be over-developed, and thus the nanoscale LED device 603 may be influenced by the etching of a metal deposition layer, which will be described below.

In (4), at least a region of a part the photoresist layer corresponding to the space between the first mounted electrode and the second mounted electrode may be removed. In other words, a width of the photoresist layer which is narrower than that of the space may be developed.

In the nanoscale LED electrode assembly of FIG. 11, the nanoscale LED devices mounted on the electrode line are irregularly arranged.

Furthermore, as illustrated in FIG. 11, when the metal deposition layer 704 is formed only on the first mounted electrode 702a and the second mounted electrode 702b, the metal contact layer 704 is not formed on the opposite end parts of the nanoscale LED devices 703a and 703b connected to the side surfaces of the mounted electrodes 702. Thus, electrical contacts of only the nanoscale LED device 703d of which the opposite end parts are connected to the upper portions of the mounted electrodes 702 may be improved. However, since in (4) at least a portion of the part of the photoresist layer corresponding to the space between the first mounted electrode and the second mounted electrode is removed, the metal contact layer may also be formed on the opposite end parts of the nanoscale LED devices connected to the side surfaces of the mounted electrodes, unlike in FIG. 11.

Next, in (5), a metal contact layer is formed by etching the metal deposition layer corresponding to the removed region of the photoresist layer.

(5) of the method may include (5-1) forming the metal contact layer by etching the metal deposition layer such that only the metal deposition layer corresponding to the removed region of the photoresist layer is removed, and (5-2), removing the photoresist layer on the etched nanoscale LED electrode assembly.

First, in (5-1), in which the metal contact layer is formed by etching the metal deposition layer such that only the metal deposition layer corresponding to the removed region of the photoresist layer is removed, the metal deposition layer corresponding to the removed region of the photoresist layer may be etched as illustrated in FIG. 8F.

A method of etching the metal deposition layer is not limited, provided that the method can be used to etch a metal. Preferably, dry etching and wet etching may be used. More preferably, dry etching may be used to etch the metal deposition layer in a certain direction. For dry etching, any type of gas can be used, provided that the gas can be used for dry etching. Preferably, $CF_4$ or $Cl_2$ may be used. When $CF_4$ is used, etching may be performed at 40 to 120 sccm, 90 to 110 W, and 0.040 to 0.070 Torr. When $Cl_2$ is used, etching may be performed at 10 to 30 sccm, 70 to 90 W, and 0.06 to 0.1 Torr.

Next, in (5-2), in which the photoresist layer on the etched nanoscale LED electrode assembly is removed, the photoresist layer 521 on the nanoscale LED electrode assembly may be removed as illustrated in FIG. 8G.

The photoresist layer 521 may be removed by immersing the nanoscale LED electrode assembly in a photoresist (PR) remover. The type of the photoresist remover is not limited, provided that it is generally used. The photoresist remover may preferably at least one selected from among a mixed solution containing 2-(2-aminoethoxy), ethanol, hydroxylamine, and catechol (EKC 265 polymer manufactured by DuPont), acetone, 1-Methyl-2-pyrrolidone (NMP), and dimethyl sulfoxide (DMSO), and more preferably, may be EKC 265 polymer.

(5-2) may be performed by immersing the nanoscale LED electrode assembly into the photoresist remover at 55 to 75° C. for 5 to 30 minutes. If the temperature is less than 55° C., the photoresist remover has low reactivity and the photoresist layer may not be easily removed. If the temperature is greater than 75° C., a defect may occur in the nanoscale LED devices and the electrodes. When the immersing of the nanoscale LED electrode assembly into the photoresist remover is performed for less than 5 minutes, the photoresist layer may not be completely removed. When the immersing of the nanoscale LED electrode assembly into the photoresist remover is performed for more than 30 minutes, a defect may occur in the nanoscale LED devices and the electrodes.

The present invention provides a nanoscale LED electrode assembly having improved electrical contacts, the nanoscale LED electrode assembly including a base substrate, an electrode line including a first mounted electrode and a second mounted electrode formed to be spaced apart from each other and in parallel with the base substrate, a plurality of nanoscale LED devices of which end parts are connected to the first mounted electrode and the second mounted electrode, and a metal contact layer having a region corresponding to interfaces between the first and second mounted electrodes and the nanoscale LED devices so as to cover upper surfaces of the mounted electrodes. In detail, a nanoscale LED electrode assembly which has a metal contact layer such as that shown in FIG. 6G, 7G, 8G, or 9G and of which electrical contacts are improved is provided.

According to an embodiment of the present invention, the metal contact layer may have a thickness of 80 to 400 nm with respect to the upper surfaces of the mounted electrodes. If the thickness of the metal contact layer is less than 80 nm, the metal contact layer is extremely thin and thus cannot completely cover one end part of each of the nanoscale LED devices which are irregularly arranged. Thus, electrical contacts may not be improved. If the thickness of the metal contact layer is greater than 400 nm, the metal contact layer may be etched, and thus a metal may be re-deposited on a side surface of a photoresist layer, thereby causing an electrical short circuit to occur.

An insulating film may be provided on outer surfaces of the nanoscale LED devices excluding the opposite end parts thereof, and residual metal of the metal contact layer may remain on portions of the outer surfaces of the nanoscale LED device which do not correspond to the interfaces between the first and second mounted electrodes and the nanoscale LED devices. If the insulating film is not provided, an electrical short circuit may occur in the nanoscale LED device connected to the mounted electrodes when the residual metal of the metal contact layer remains on the portions of the outer surfaces of the nanoscale LED device. However, the nanoscale LED devices according to the present invention includes the insulating film, and the above-described problem may be prevented from occurring.

Nanoscale light-emitting diode (LED) devices included in a nanoscale LED electrode assembly according to the present invention may include blue, green and red LED devices, and are applicable to, when the nanoscale LED electrode assembly includes the blue LED device, an illumination fixture or a display device which is in a color-by-blue form or a white-by-blue form including either at least one luminous body selected from the group consisting of a blue-green luminous body, a green luminous body, a yellow luminous body, a yellowish-brown luminous body, and a red luminous body or a color conversion layer formed of inorganic phosphors or quantum dots (QDs).

While embodiments of the present invention have been described above with reference to the accompanying drawings, these embodiments are merely examples and the present invention is not limited thereto. It will be apparent to those of ordinary skill in the field to which embodiments of the present invention pertain that various changes and modifications can be made in the embodiments without departing from essential features of the present invention. For example, the components of the embodiments of the present invention may be embodied in many different forms. Such changes and modifications should be understood to fall within the scope of the present invention as defined in the appended claims.

The present invention will now be described with respect to the following examples. However, the following examples are merely provided to help understand the present invention and to provide examples of the invention. Accordingly, the scope of the present invention is not limited to the following examples.

EXAMPLES

Preparative Example 1

An electrode line as illustrated in FIG. 2 was manufactured on a base substrate formed of quartz and having a thickness of 850 μm. In this case, in the electrode line, a first mounted electrode had a width of 3 μm, a second mounted electrode had a width of 3 μm, a distance between the first mounted electrode and the second mounted electrode adjacent to the first mounted electrode was 2.5 μm, and the electrodes had a thickness of 0.2 μm. The first mounted electrode and the second mounted electrode were formed of titanium/gold. An area of the electrode line on which these nanoscale LED devices were mounted was $4.2 \times 10^7$ μm².

Thereafter, a dispersion solution including nanoscale LED devices was prepared by mixing 1.0 parts by weight of nanoscale LED devices with respect to 100 parts by weight of acetone. The nanoscale LED devices had specifications shown in Table 1 below and had a structure as illustrated in FIG. 6, and portions of the nanoscale LED devices including an active layer were coated with an insulating film as shown in Table 1 below.

A nanoscale LED electrode assembly was manufactured by dropping the prepared dispersion solution onto a region of the electrode line and applying an AC voltage (voltage Vac=30 V, frequency=950 kHz) to the electrode line for 1 minute.

TABLE 1

|  | Material | Height (μm) | Diameter (μm) |
|---|---|---|---|
| First mounted electrode layer | chromium | 0.03 | 0.5 |
| First conductive semiconductor layer | n-GaN | 2.14 | 0.5 |
| Active layer | InGaN | 0.1 | 0.5 |
| Second conductive semiconductor layer | p-GaN | 0.2 | 0.5 |
| Second mounted electrode layer | chromium | 0.03 | 0.5 |
| Insulating film | aluminum oxide |  | 0.02 (thickness) |
| Nanoscale LED devices | — | 2.5 | 0.52 |

Example 1

The nanoscale LED electrode assembly manufactured in Preparative example 1 above was thermally processed at 810° C. for 2 minutes. Thereafter, a liftoff layer (LOR 5B, MICROCHEM) was formed on the nanoscale LED electrode assembly by performing spin coating at 3000 rpm for 35 seconds, and then soft-baking was performed at 150° C. for 5 minutes. The liftoff layer had a thickness of 600 nm.

A photoresist layer (DNR-L300-30, DONGJIN SEMICHEM) was formed on an upper surface of the liftoff layer by performing spin coating at 3000 rpm for 35 seconds, and then soft-baking was performed at 90° C. for 1.5 minutes. The photoresist layer had a thickness of 1.8 μm.

UV rays were irradiated onto the nanoscale LED electrode assembly for 24 seconds using the back exposure method, and then the nanoscale LED electrode assembly was thermally processed at 110° C. for 1.5 minutes. Thereafter, the nanoscale LED electrode assembly was developed by immersing it in a developing solution (AZ300, AZEM) for 170 seconds. A step of 1 μm was formed between side surfaces of the photoresist layer and the liftoff layer remaining on the developed nanoscale LED electrode assembly, and Cr/Au was deposited to bury a portion of a dented part of the liftoff layer. After Cr/Au was deposited, a metal contact layer was formed by lifting off the liftoff layer. The metal contact layer had a thickness of 140 nm with respect to upper surfaces of the mounted electrodes.

Example 2

A nanoscale LED electrode assembly was manufactured in the same way as in Example 1, except that the liftoff layer was not formed.

Example 3

A nanoscale LED electrode assembly was manufactured in the same way as in Example 1, except that the performing of the RTA process at 810° C. for 2 minutes on the nanoscale LED electrode assembly manufactured in Preparative Example 1 was skipped.

Example 4

The nanoscale LED electrode assembly manufactured in Preparative example 1 was thermally processed at 810° C. for 2 minutes. Thereafter, an aluminum (Al) deposition layer was formed on the nano scale LED electrode assembly, and a negative photoresist layer (DNR-L300-30, DONGJIN SEMICHEM) was formed on a metal deposition layer by performing spin coating at 3000 rpm for 35 seconds, and then soft-baking was performed at 90° C. for 1.5 minutes. The negative photoresist layer had a thickness of 1.8 μm.

A region of the photoresist layer corresponding to a space between a first mounted electrode and a second mounted electrode was removed by forming a mask corresponding to a space between the first mounted electrode and the second mounted electrode on the negative photoresist layer, irradiating UV rays onto the nanoscale LED electrode assembly using the direct lithography method, and developing the UV-irradiated nanoscale LED electrode assembly by immersing it in a developing solution (AZ300, AZEM) for 60 seconds. Thereafter, the metal deposition layer corresponding to the removed region of the photoresist layer was etched by performing dry etching using $CF_4$ at 50 sccm, 100 W, and 0.055 Torr. Lastly, a metal contact layer was formed by removing the photoresist layer remaining on the nanoscale LED electrode assembly by immersing the photoresist layer in a photoresist remover (AZ 700, AZEM) at 60° C. for 15 minutes. The metal contact layer had a thickness of 140 nm with respect to upper surfaces of the mounted electrodes.

In Example 4, nanoscale LED devices including an insulating film on outer regions, excluding outer surfaces of opposite end parts of the nanoscale LED devices, were used.

Comparative Example 1

An electroplating solution was put into an electrolyzer to perform an electroplating process. The electroplating solution was prepared at a concentration of 0.05 mM by diluting $HAuCl_4$ (manufactured by Aldrich, 99.99% trace metals basis, 30 weight % in dilute HCl) with deionizer water. Next, a working electrode, a reference electrode, and a counter electrode 450 were immersed into the electroplating solution. The nanoscale LED electrode assembly manufactured in Preparative example 1 was used as the working electrode. An Ag/AgCl electrode was used as the reference electrode. A Pt plate was used as the counter electrode. Next, the working electrode, the reference electrode, and the counter electrode were electrically connected to a power source. In this case, the counter electrode was connected to counter electrode (+) terminal of the power source, the first mounted electrode of the nanoscale LED electrode assembly manufactured in Preparative Example 1 was connected as the working electrode to a (−) terminal of the power source, and −0.2 V pulse waves from the power source were supplied thereto for 25 minutes. A nanoscale LED electrode assembly having a metal layer was manufactured by supplying the power source thereto for 2 seconds and pausing the supplying of the power source for 2 seconds. The metal layer had a thickness of 50 nm with respect to upper surfaces of the mounted electrodes.

Comparative Example 2

A nanoscale LED electrode assembly having a metal layer was manufactured in the same way as in Comparative example 1, except that power was supplied for 40 minutes. The metal layer had a thickness of 50 nm with respect to upper surfaces of mounted electrodes.

Comparative Example 3

A nanoscale LED electrode assembly from which a solvent was removed was manufactured by thermally processing the nanoscale LED electrode assembly manufactured in Preparative Example 1 at 810° C. for 2 minutes.

Experimental Examples

Experimental Example 1

Nanoscale LED devices emitting blue light were observed by applying an AC voltage (voltage $V_{Ac}$=60 Vpp, frequency=60 Hz) to electrode lines of the nanoscale electrode assemblies manufactured in the above-described examples and comparative examples for 1 minute.

Thereafter, a ratio of the number of nanoscale LED devices emitting blue light to the number of the nanoscale LED devices actually mounted on each of the electrode lines was measured and shown in Table 2 below.

TABLE 2

| | Example 1 | Example 2 | Example 3 | Example 4 | Comparative example 1 | Comparative example 2 | Comparative example 3 |
|---|---|---|---|---|---|---|---|
| Ratio (%)[1] | 100 | 48 | 24 | 95 | 33 | 33 | 20 |

[1] In Table 2 above, the "ratio" represents a ratio of the number of nanoscale LED devices emitting blue light to the number of mounted nanoscale LED devices of Examples relative to that of Example 1 when the ratio of Example 1 is 100.

As shown in Table 2 above, the ratios of the number of the nanoscale LED devices emitting blue light to the number of the mounted nanoscale LED devices in Examples 1 and 4 which satisfied all processes and conditions of the present invention, were higher than those in Examples 2 and 3 and Comparative Examples which did not satisfy the processes and conditions.

In detail, in Example 1, when developing was performed using the back exposure method, UV rays did not penetrate the first and second mounted electrodes, and thus the photoresist layer was developed such that upper portions of opposite end parts of the nanoscale LED devices were additionally exposed. Accordingly, it was possible for the opposing end parts of the nanoscale LED devices to be more easily covered with the metal contact layer, and it was possible for nanoscale LED devices which were poorly connected to some electrodes to be connected to the electrodes, thereby improving electrical contacts. Thus, the number of nanoscale LED devices emitting blue light was large. Accordingly, contact characteristics of the nanoscale LED devices and the electrodes were improved due to the metal layer.

In Example 2, the liftoff layer was not formed, and thus the metal contact layer was not easily formed on the opposite end parts of the nanoscale LED devices connected to the side surfaces of the mounted electrodes. Accordingly, the number of nanoscale LED devices emitting blue light was small.

In Example 3, since the RTA process was not performed, dopants of the nanoscale LED devices were not activated and resistance values of electrodes of which end parts included the nanoscale LED devices were high. Thus, the resistance values of entire nanoscale LED devices was high. Accordingly, the number of LED devices emitting light at a corresponding driving voltage was low.

In Example 4, dry etching was used as in (5) of the method according to the second embodiment of the present invention, and thus etching was directionally performed in a direction perpendicular to a lengthwise direction of the nanoscale LED devices and parallel with a direction of a height of the electrode line. Furthermore, the insulating film was included and an electrical short circuit was prevented from occurring even when metal remained on surfaces of the nanoscale LED devices. Accordingly, the number of nanoscale LED devices emitting blue light was high.

Figure 12:
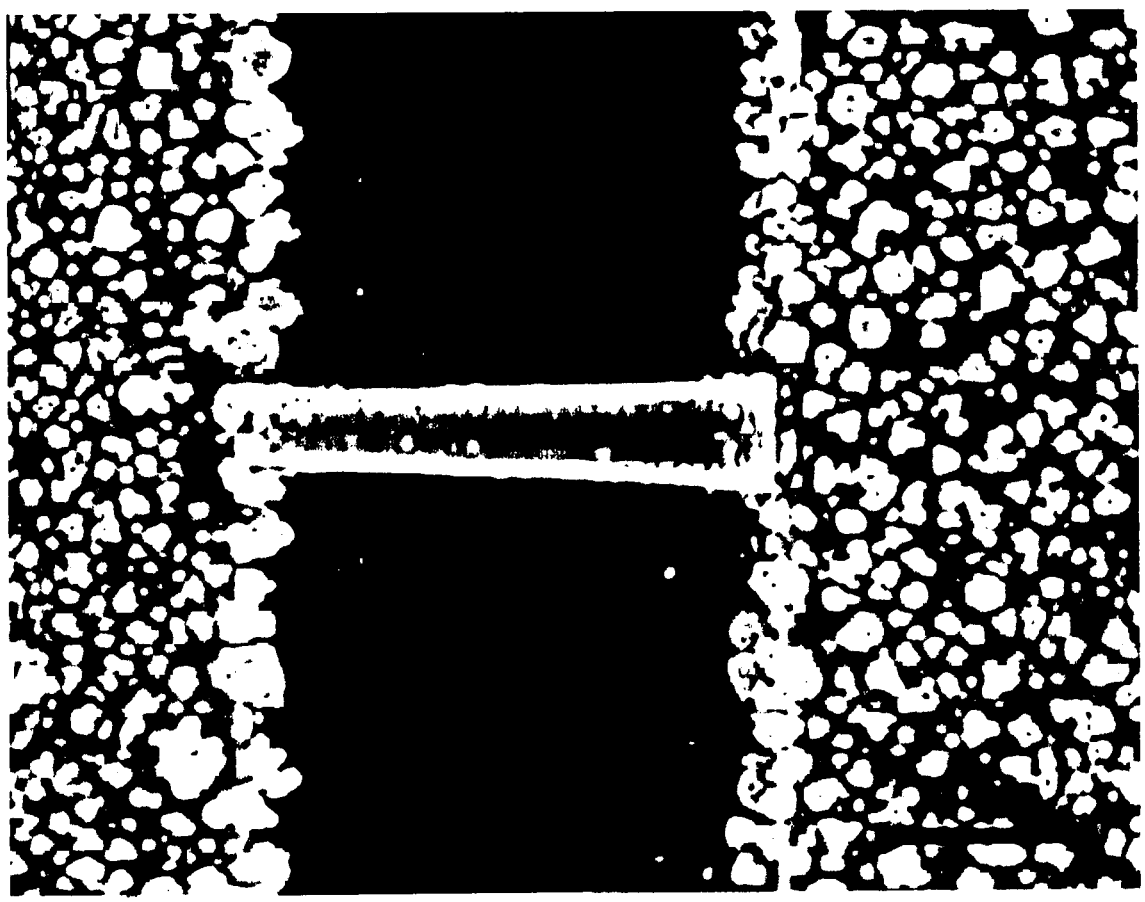
FIG. 12 is a scanning electronic microscope (SEM) photograph of a nanoscale LED electrode assembly having thereon a metal layer, according to comparative example 1 of the present invention.

In Comparative example 1, the metal layer was formed thinly. and thus electrical contacts of the nanoscale LED devices connected to a side surface of the electrode line were not improved. Accordingly, contact characteristics of the nanoscale LED devices were not improved to a desired level. As illustrated in FIG. 12, the contact characteristics of the nanoscale LED devices and the electrodes were not easily improved by electroplating. Accordingly, the number of nanoscale LED devices emitting light was low.

In Comparative example 2, the thickness of the formed metal layer was the same as those in the other examples, but the electrodes and the nanoscale LED devices were broken or damaged since a voltage was continuously applied to the metal layer for a long time. Accordingly, the number of nanoscale LED devices emitting blue light was low.

In Comparative example 3, the contact characteristics of the nanoscale LED devices connected by being inserted into the side surfaces of the mounted electrodes were not improved. Accordingly, the number of nanoscale LED devices actually emitting light was low.

Experimental Example 2

Amounts of time required to lift off the photoresist layers in Examples 1 and 2 above were measured and shown in Table 3 below.

TABLE 3

| | Example 1 | Example 2 |
|---|---|---|
| Lifting off time (s) | 60 seconds | 540 seconds |

As shown in Table 3 above, a lifting off time in Example 1 including the liftoff layer was far shorter than that in Example 2 which did not include the liftoff layer.

In detail, according to Example 1, a step was formed between the photoresist layer and the liftoff layer during a developing operation, and thus the liftoff layer was more easily lifted off. In contrast, a step was not formed in Example 2, which did not include the liftoff layer, and thus it was difficult to lift off the photoresist layer. Accordingly, a lifting off time was long.

In a nanoscale LED electrode assembly having improved electrical contacts and a method of manufacturing the same according to the present invention, in order to improve contact between LED devices and electrodes, a conductive material is deposited at interfaces between the LED devices and the electrodes, and thus the conductivity between the LED devices and the electrodes may be increased and contact resistance may be decreased, thereby improving the light extraction efficiency of the LED devices.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A display device comprising:
   a base substrate;
   a first electrode on the base substrate;
   a second electrode on the base substrate and spaced apart from the first electrode;
   a plurality of light-emitting diodes (LEDs) disposed on the first electrode and the second electrode, the plurality of LEDs comprising an LED;
   a first contact electrode on the first electrode; and
   a second contact electrode on the second electrode,
   wherein the first contact electrode contacts a first end portion of the LED and the second contact electrode contacts a second end portion of the LED, and
   the first and second contact electrodes have a protrusion protruding toward the first electrode and the second electrode that are spaced apart from each other.

2. The display device of claim 1,
   wherein the first electrode and the second electrode extend in a first direction, and the first electrode and the second electrode are spaced apart from each other in a second direction crossing the first direction.

3. The display device of claim 2, wherein the first electrode comprises a first portion extending in the second direction and a second portion extending in the first direction, and the second electrode comprises a third portion extending in the second direction and a fourth portion extending in the first direction,
   wherein the LED is between the second portion of the first electrode and the fourth portion of the second electrode.

4. The display device of claim 3, wherein the first portion of the first electrode and the second portion of the second electrode are spaced apart from each other in the first direction.

5. The display device of claim 2, wherein the first contact electrode extends in the first direction on the first electrode, and
   the second contact electrode extend in the first direction on the second electrode.

6. The display device of claim 1,
   wherein the first electrode comprises a first portion that is at least partially curved, and the second electrode comprises a second portion that is at least partially curved,
   wherein the first portion and the second portion face each other.

7. The display device of claim 6,
   wherein the first electrode and the second electrode have a spiral shape and are spaced apart from each other on the base substrate.

8. The display device of claim 1, wherein the first contact electrode contacts a side surface of the first end portion of the LED, and the second contact electrode contacts a side surface of the second end portion of the LED.

9. The display device of claim 1, wherein at least one of the end portions of the LED is on the first electrode or the second electrode.

10. The display device of claim 9, wherein the first contact electrode contacts an outer surface of the first end portion of the LED, and the second contact electrode contacts an outer surface of the second end portion of the LED.

11. The display device of claim 1, wherein a side surface of the first electrode contacts a side surface of the first end portion of the LED, and a side surface of the second electrode contacts a side surface of the second end portion of the LED.

12. The display device of claim 1, wherein the LED extends in one direction, and
    the one direction is substantially parallel to a direction along which the first electrode and the second electrode are spaced apart from each other.

13. The display device of claim 12, wherein a length of the LED measured along the one direction is 100 nm to 10 um, and
    an aspect ratio of the LED is 1.2 to 100.

14. The display device of claim 13, wherein the LED comprises an insulating film at an outer surface of the LED except at opposite end portions thereof.

15. The display device of claim 14, wherein the plurality of LEDs comprises at least one electrode layer on at least one of the end portions of at least one of the LEDs.

16. The display device of claim 1, wherein the first and second contact electrodes have a thickness of 80 to 400 nm with respect to upper surfaces of the first and second electrodes.

17. A display device comprising:
    a base substrate;
    a first electrode and a second electrode that are spaced apart from each other, the first electrode and the second electrode being located at a same plane on the base substrate;
    a plurality of light-emitting diodes (LEDs) disposed on the first electrode and the second electrode, the plurality of LEDs comprising an LED; and
    a contact electrode layer on the first and second electrodes;
    wherein the contact electrode layer covers upper surfaces of the first and second electrodes, a first portion of the contact electrode layer covering the upper surface of the first electrode being spaced from a second portion of the contact electrode layer covering the upper surface of the second electrode, and
    the contact electrode layer has a protrusion protruding toward the first electrode and the second electrode that are spaced apart from each other.

18. The display device of claim 17, wherein at least one end portion of the LED is on the first electrode or the second electrode.

19. The display device of claim 18, wherein a residual metal of the contact electrode layer is on outer surfaces of the LED except for a region corresponding to interfaces between the first and second electrodes and the LED.

20. The display device of claim 17, wherein the contact electrode layer contacts a side surface of an end portion of the LED.

* * * * *